US012808056B2

(12) United States Patent
Lu et al.

(10) Patent No.: US 12,808,056 B2
(45) Date of Patent: Nov. 24, 2026

(54) CHAMBER ARRANGEMENTS, SEMICONDUCTOR PROCESSING SYSTEMS HAVING CHAMBER ARRANGEMENTS, AND RELATED MATERIAL LAYER DEPOSITION METHODS

(71) Applicant: ASM IP Holding, B.V., Almere (NL)

(72) Inventors: Yanfu Lu, Phoenix, AZ (US); Caleb Miskin, Mesa, AZ (US); Alexandros Demos, Scottsdale, AZ (US); Amir Kajbafvala, Chandler, AZ (US); Arun Murali, Tempe, AZ (US)

(73) Assignee: ASM IP Holding B.V., Almere (NL)

( * ) Notice: Subject to any disclaimer, the term of this patent is extended or adjusted under 35 U.S.C. 154(b) by 568 days.

(21) Appl. No.: 18/458,101

(22) Filed: Aug. 29, 2023

(65) Prior Publication Data

US 2024/0068103 A1 Feb. 29, 2024

Related U.S. Application Data

(60) Provisional application No. 63/374,181, filed on Aug. 31, 2022.

(51) Int. Cl.

| | |
|---|---|
| ***C23C 16/52*** | (2006.01) |
| ***C23C 16/30*** | (2006.01) |
| ***C23C 16/458*** | (2006.01) |
| ***C23C 16/46*** | (2006.01) |
| ***G01J 5/02*** | (2022.01) |
| ***G01K 7/04*** | (2006.01) |

(52) U.S. Cl.

CPC .............. *C23C 16/52* (2013.01); *C23C 16/30* (2013.01); *C23C 16/4584* (2013.01); *C23C 16/46* (2013.01); *G01J 5/0205* (2013.01); *G01K 7/04* (2013.01)

(58) Field of Classification Search

CPC ..... C23C 16/30; C23C 16/4584; C23C 16/46; C23C 16/52; C30B 25/10; C30B 25/105; C30B 25/16; G01J 5/0007; G01J 5/0205; G01K 7/02; G01K 7/04; G01K 13/08; H10P 72/0434; H10P 72/0436; H10P 72/0602

See application file for complete search history.

(56) References Cited

U.S. PATENT DOCUMENTS

| | | | |
|---|---|---|---|
| 5,017,761 | A | 5/1991 | Brunner |
| 5,900,177 | A | 5/1999 | Lecouras |
| 6,342,691 | B1 | 1/2002 | Johnsgard |

(Continued)

*Primary Examiner* — Benjamin Kendall

(74) *Attorney, Agent, or Firm* — Banner & Witcoff, Ltd.

(57) ABSTRACT

A chamber arrangement has a chamber body with upper and lower walls. A substrate support is arranged within an interior of the chamber body and supported for rotation about a rotation axis. An upper heater element array is supported above the upper wall and a lower heater element array supported below the lower wall. A pyrometer is supported above the upper heater element array, is optically coupled to the interior of the chamber body, and is operably connected to the upper heater element array. A thermocouple is arranged within the interior of the chamber body, is in intimate mechanical contact with the substrate support, and is operably connected to the lower heater element array. Semiconductor processing systems and material layer deposition methods are also described.

15 Claims, 15 Drawing Sheets

(56) References Cited

U.S. PATENT DOCUMENTS

| | | | | |
|---|---|---|---|---|
| 6,373,033 | B1 * | 4/2002 | de Waard | G05B 13/027 219/486 |
| 6,492,625 | B1 | 12/2002 | Boguslavskiy | |
| 6,596,973 | B1 * | 7/2003 | Donald | C30B 25/16 219/390 |
| 8,150,243 | B2 | 4/2012 | Kumagai | |
| 11,312,069 | B2 | 4/2022 | Defelice | |
| 2002/0125239 | A1 | 9/2002 | Chen | |
| 2010/0031884 | A1 * | 2/2010 | Aggarwal | C23C 16/4585 118/712 |
| 2013/0112680 | A1 | 5/2013 | Moritz | |
| 2013/0130184 | A1 * | 5/2013 | Lu | F27D 21/00 432/32 |
| 2016/0138185 | A1 | 5/2016 | Hori | |
| 2019/0127851 | A1 * | 5/2019 | Lau | B23K 26/0006 |
| 2019/0276934 | A1 | 9/2019 | Verghese | |
| 2020/0080894 | A1 * | 3/2020 | Leow | C23C 16/4586 |
| 2022/0298672 | A1 | 9/2022 | M'Saad | |
| 2022/0301905 | A1 * | 9/2022 | Ye | C23C 16/46 |

* cited by examiner

CHAMBER ARRANGEMENTS, SEMICONDUCTOR PROCESSING SYSTEMS HAVING CHAMBER ARRANGEMENTS, AND RELATED MATERIAL LAYER DEPOSITION METHODS

CROSS-REFERENCE TO RELATED APPLICATION(S)

This application claims the benefit of U.S. Provisional Application 63/374,181 filed on Aug. 31, 2022, the entire contents of which are incorporated herein by reference.

FIELD OF THE DISCLOSURE

The present disclosure relates generally to temperature control, and more particularly, to controlling substrate temperature during the deposition of material layers onto substrates during the fabrication of semiconductor devices.

BACKGROUND OF THE DISCLOSURE

Material layers are commonly deposited onto substrates during the fabrication of semiconductor devices, such as during the fabrication of integrated circuits and power electronic devices. Material layer deposition is generally accomplished by supporting a substrate within a chamber arrangement, heating the substrate to a desired deposition temperature, and flowing one or more material layer precursor through the chamber arrangement and across the substrate. As the precursor flows across the substrate the material layer progressively develops onto the surface of the substrate, typically according to temperature of the substrate and environmental conditions within the chamber arrangement.

Substrate heating may be accomplished using heater elements arranged outside of the chamber arrangement, such as heater elements radiantly coupled to the substrate support through walls of the chamber arrangement. Such heater elements may generate heat according to electrical power applied to each of heater elements. The power applied to the heater elements may in turn be adjusted according to temperature measurements acquired from a temperature sensor in thermal communication with the chamber arrangement. For example, temperature of the substrate may be inferred using a pyrometers or a thermocouple. Pyrometers can be employed to remotely provide temperature of a target using electromagnetic radiation emitted by the target in real-time with the emission of the electromagnetic radiation. While pyrometers avoid the need to physically contact the target in order to provide temperature of target, electromagnetic radiation emitted by other structure in the target environment can influence accuracy of the temperature information provided by a pyrometer. For example, when a substrate is relatively cool such as during temperature ramping to a desired deposition temperature, intensity of electromagnetic radiation at wavelengths emitted by the substrate may be relatively low, and the pyrometer may have difficulty discriminating between electromagnetic radiation emitted by other structure in the substrate environment and that emitted by the substrate.

Thermocouples commonly include two metal elements joined to one another at junction. The metal elements are generally formed from two different metals selected to generate a voltage corresponding to temperature at the thermocouple junction. The voltage generated by the dissimilar metals is typically correlated to temperature and temperature at the junction reported by applying the correlation to the voltage output by the thermocouple at a given time. While relatively inexpensive and reliable, thermocouples typically require that temperature change be telegraphed to the thermocouple junction such that the temperature change can be reflected in the thermocouple output voltage. Thermocouple response to temperature change may therefore lag temperature change in the target being measured, potentially causing temperature overshoot.

Such systems and methods have generally been acceptable for their intended purpose. However, there remains a need in the art for improved chamber arrangements, semiconductor processing systems having chamber arrangements, and methods of deposition material layers onto substrates in semiconductor processing systems using such chamber arrangements. The present disclosure provides a solution to this need.

SUMMARY OF THE DISCLOSURE

A chamber arrangement is provided. The chamber arrangement has a chamber body with an upper wall and a lower wall. A substrate support is arranged within an interior of the chamber body and supported for rotation about a rotation axis. An upper heater element array is supported above the upper wall of the chamber body and a lower heater element array supported below the lower wall of the chamber body. A pyrometer is supported above the upper heater element array, is optically coupled to the interior of the chamber body, and is operably connected to the upper heater element array. A thermocouple is arranged within the interior of the chamber body, is in intimate mechanical contact with the substrate support, and is operably connected to the lower heater element array.

In addition to one or more of the features described above, or as an alternative, further examples may include that the thermocouple is a rotating thermocouple, and the chamber arrangement may include a static thermocouple. The static thermocouple may be fixed relative to the chamber body and operably connected to the lower heater element array.

In addition to one or more of the features described above, or as an alternative, further examples may include that the pyrometer is a first pyrometer optically coupled to the substrate support by a first optical axis and that the chamber arrangement incudes a second pyrometer. The second pyrometer may be supported above the chamber body and optically coupled to the substrate support by a second optical axis. The second optical axis may be radially outward of the first optical axis.

In addition to one or more of the features described above, or as an alternative, further examples may include that the second pyrometer is operatively connected to the upper heater element array. The first pyrometer and the second pyrometer may be operably disconnected from the lower heater element array.

In addition to one or more of the features described above, or as an alternative, further examples may include that the upper heater element array includes a first upper heater element and a second upper heater element both supported above the chamber body. The second upper heater element may be longitudinally offset from the first upper heater element between an injection end and an exhaust end longitudinally opposite the injection end of the chamber body, the first pyrometer may be operably connected to the first upper heater element, and the second pyrometer may be operably connected to the second upper heater element.

In addition to one or more of the features described above, or as an alternative, further examples may include a third pyrometer. The third pyrometer may be arranged along a third optical axis and optically coupled to the substrate support. The third optical axis may be radially intermediate the first optical axis and the second optical axis.

In addition to one or more of the features described above, or as an alternative, further examples may include that the upper heater element array may include comprises a first upper heater element supported above the chamber body; a second upper heater element supported above the chamber body and longitudinally offset from the first upper heater element between an injection end and an exhaust end of the chamber body, the exhaust end longitudinally opposite the injection end of the chamber body; and at least one third upper heater element supported above the chamber body and arranged longitudinally between the injection end and the exhaust end of the chamber body. The first pyrometer may be operably connected to the first upper heater element, the second pyrometer is operably connected to the second upper heater element, and the third pyrometer may be operably connected to the at least one third upper heater element.

In addition to one or more of the features described above, or as an alternative, further examples may include that the second optical axis is circumferentially offset from the first optical axis. The third optical axis may be circumferentially offset from the both the second optical axis and the first optical axis.

In addition to one or more of the features described above, or as an alternative, further examples may include that the upper heater element array includes a plurality of upper heater elements, that the lower heater element array may include a plurality of lower heater elements, and the plurality of lower heater elements may be orthogonal to the plurality of upper heater elements.

In addition to one or more of the features described above, or as an alternative, further examples may include a controller operably connecting the thermocouple to both the lower heater element array and the pyrometer to the upper heater element array.

In addition to one or more of the features described above, or as an alternative, further examples may include that the thermocouple is rotating thermocouple and that the chamber arrangement may further include a static thermocouple arranged within the chamber body and fixed relative to the chamber body. The controller may be responsive to instructions recorded on a memory to assign a first lower heater element of the lower heater element array to a first lower heating zone and a second lower heater element of the lower heater element array to a second lower heating zone, and throttle heat generated by the first lower heater element using a first tactile temperature measurement provided by the rotating thermocouple and the second lower heater element using a second tactile temperature measurement provided by the static thermocouple. Heat generated by the first lower heater element and the second lower heater element are controlled independent of an optical temperature measurement acquired by the pyrometer.

In addition to one or more of the features described above, or as an alternative, further examples may include that the instructions further cause the controller to throttle heat output of the first lower heater element and the second lower heater element according to a temperature differential between the first tactile temperature measurement and the second tactile temperature measurement.

In addition to one or more of the features described above, or as an alternative, further examples may include that the pyrometer is a first pyrometer arranged along a first optical axis and that the chamber arrangement further comprises a second pyrometer arranged along a second optical axis radially outward of the first optical axis. The controller may be responsive to instructions recorded on a memory to assign a first upper heater element of the upper heater element array to a first upper heating zone and a second upper heater element of the upper heater element array to a second upper heating zone and throttle heat generated by the first upper heater element using a first optical temperature measurement provided by the first pyrometer and the second lower heater element using a second optical temperature measurement provided by the second pyrometer. Heat generated by the first upper heater element and the second upper heater element are throttled independently of a tactile temperature measurement provided by the thermocouple.

In addition to one or more of the features described above, or as an alternative, further examples may include that the instructions further cause the controller to throttle heat generated by the first upper heater element and the second upper heater element according to a temperature differential between the first optical temperature measurement and the second optical temperature measurement.

In addition to one or more of the features described above, or as an alternative, further examples may include that the pyrometer is a first pyrometer arranged along a first optical axis and that the chamber arrangement further comprises a second pyrometer arranged along a second optical axis radially outward of the first optical axis and a third pyrometer arranged along a third optical axis radially intermediate the first optical axis and the second optical axis. The controller may be responsive to instructions recorded on a memory to assign a first upper heater element of the upper heater element array to a first upper heating zone, a second upper heater element of the upper heater element array to a second upper heating zone, and at least one third upper heater element to a third upper heating zone; throttle heat generated by the first upper heater element using a first optical temperature measurement provided by the first pyrometer, the second upper heater element using a second optical temperature measurement provided by the second pyrometer, and the at least one third upper heater element to a third optical temperature measurement provided by the third pyrometer. The first upper heater element, the second upper heater element, and the at least one third upper heater element may be throttled independent of a tactile temperature measurement provided by the thermocouple.

In addition to one or more of the features described above, or as an alternative, further examples may include the instructions further cause the controller to throttle heat generated by the first upper heater element, the second upper heater element, and the at least one third upper heater element according to a temperature gradient defined by the first optical temperature measurement, the second optical temperature measurement, and the third optical temperature measurement.

In addition to one or more of the features described above, or as an alternative, further examples may include that the thermocouple is a first static thermocouple and that the chamber arrangement further includes a divider, a second static thermocouple, and a controller. The divider may be fixed within an interior of the chamber body and extend about the substrate support. The divider may further have an injection portion and an exhaust portion longitudinally separated from one another by the substrate support. The first static thermocouple may be connected to the injection portion of the divider, the second static thermocouple connected to the exhaust portion of the divider and separated from the first static thermocouple by the substrate support, and the controller may be disposed in communication with the first static thermocouple and the second thermocouple to (a) determine a temperature differential between the injection portion and the exhaust portion of the divider using an injection portion temperature measurement acquired by the first static thermocouple and the second static thermocouple; (b) compare the determined temperature differential to a predetermined temperature value; and (c) increase heating of one of the injection portion of the divider and the exhaust portion of the divider relative to the other of the injection portion and the exhaust portion of the divider.

A semiconductor processing system is provided. The system includes a precursor delivery arrangement including a silicon-containing precursor, a chamber arrangement as described above connected to the precursor delivery arrangement and having a substrate is seated on the substrate support, and a controller operably connecting the pyrometer to the upper heater element array and the thermocouple to the lower heater element array.

A material layer deposition method is provided. The method includes, at a chamber arrangement as described above, seating a substrate on the substrate support, flowing a material layer precursor across the substrate, depositing a material layer onto the substrate using the material layer precursor, throttling heat generated by the upper heater element array using an optical temperature measurement acquired by the pyrometer, and independently throttling heat generated by the lower heater element array using a tactile temperature measurement acquired by the thermocouple.

In addition to one or more of the features described above, or as an alternative, further examples may include that the pyrometer is a first pyrometer arranged along a first optical axis, the optical temperature measurement is a first optical temperature measurement, and that the chamber arrangement includes a second pyrometer arranged along a second optical axis radially outward of the first optical axis. The method may further include acquiring a second optical temperature measurement from the second pyrometer, throttling heating of the substrate with the upper heater element array using the optical temperature measurement acquired from the first pyrometer and the second optical temperature measurement acquired by the second pyrometer, and throttling heating of the substrate with the lower heater element array using the tactile temperature measurement acquired by the thermocouple and independent of both the first optical temperature measurement and the second optical temperature measurement.

In addition to one or more of the features described above, or as an alternative, further examples may include that throttling heating of the substrate with the upper heater element array includes throttling heating of the substrate according to a temperature differential or a temperature gradient across an upper surface of the substrate determined using the first optical temperature measurement and the second optical temperature measurement.

This summary is provided to introduce a selection of concepts in a simplified form. These concepts are described in further detail in the detailed description of examples of the disclosure below. This summary is not intended to identify key features or essential features of the claimed subject matter, nor is it intended to be used to limit the scope of the claimed subject matter.

BRIEF DESCRIPTION OF THE DRAWING FIGURES

These and other features, aspects, and advantages of the invention disclosed herein are described below with reference to the drawings of certain embodiments, which are intended to illustrate and not to limit the invention.

Figure 1:
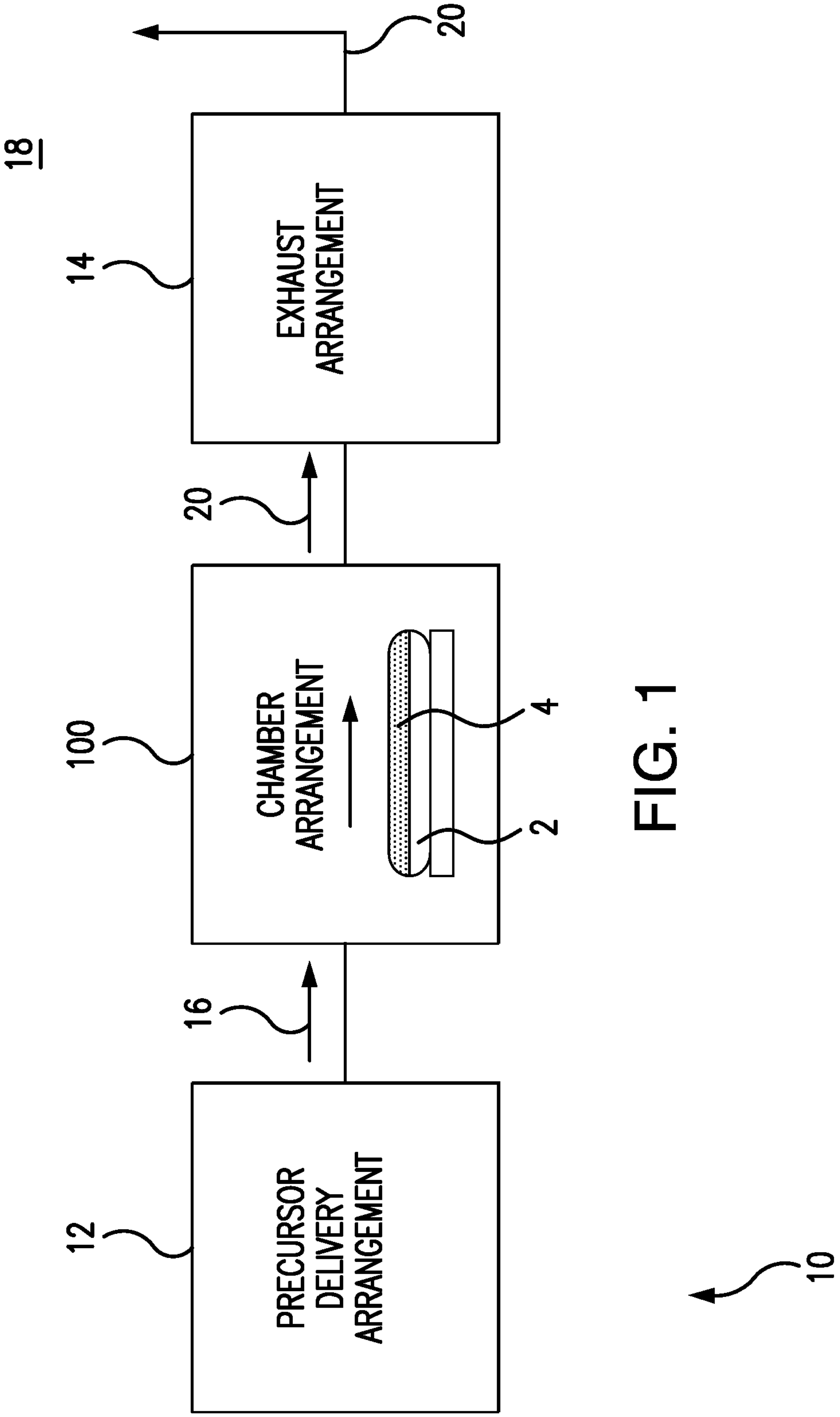
FIG. 1 is a schematic view of a semiconductor processing system including a chamber arrangement in accordance with the present disclosure, showing a precursor delivery arrangement connected to an exhaust arrangement by a chamber arrangement.
Figure 11:
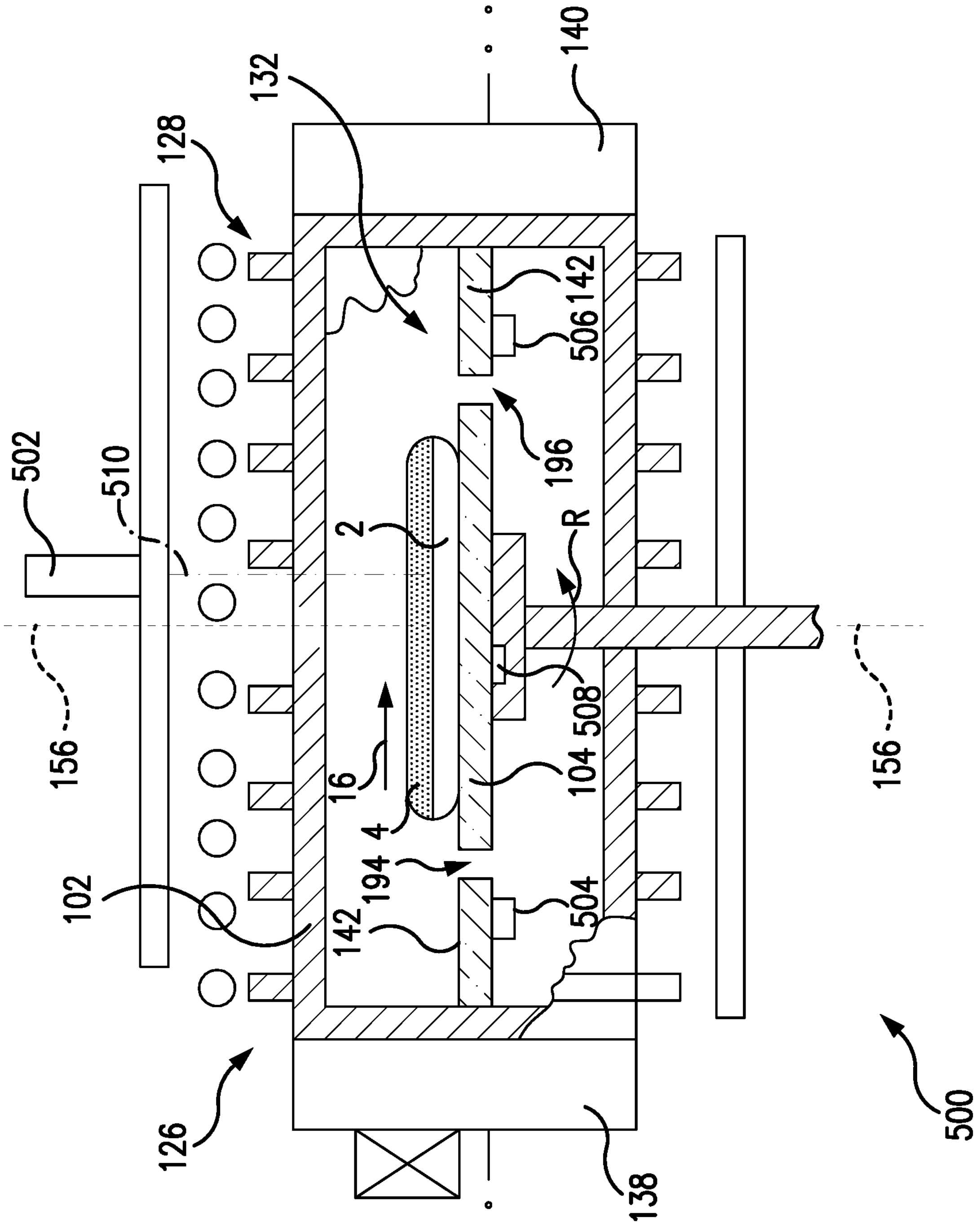
Figure 12:
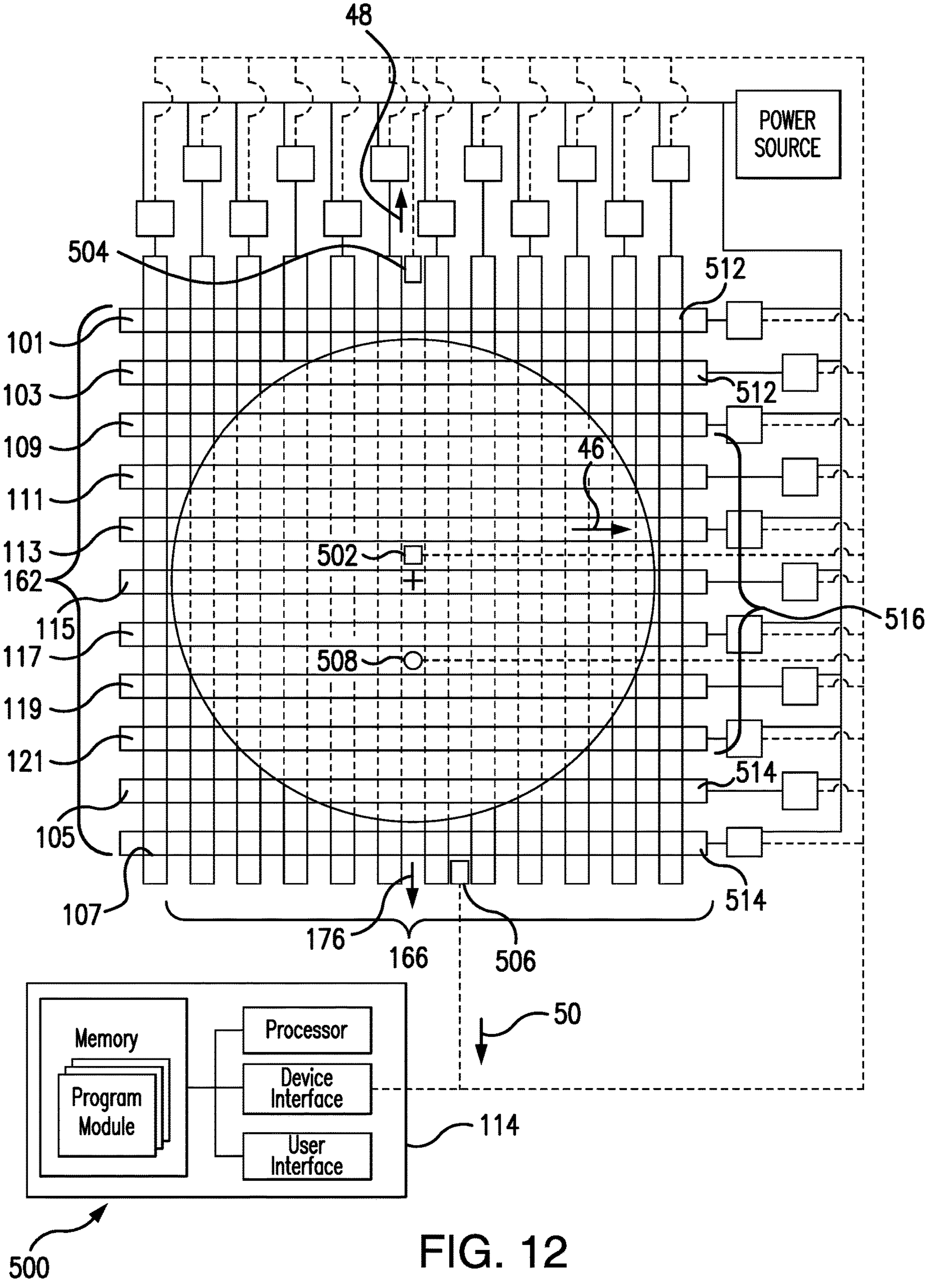
Figure 13:
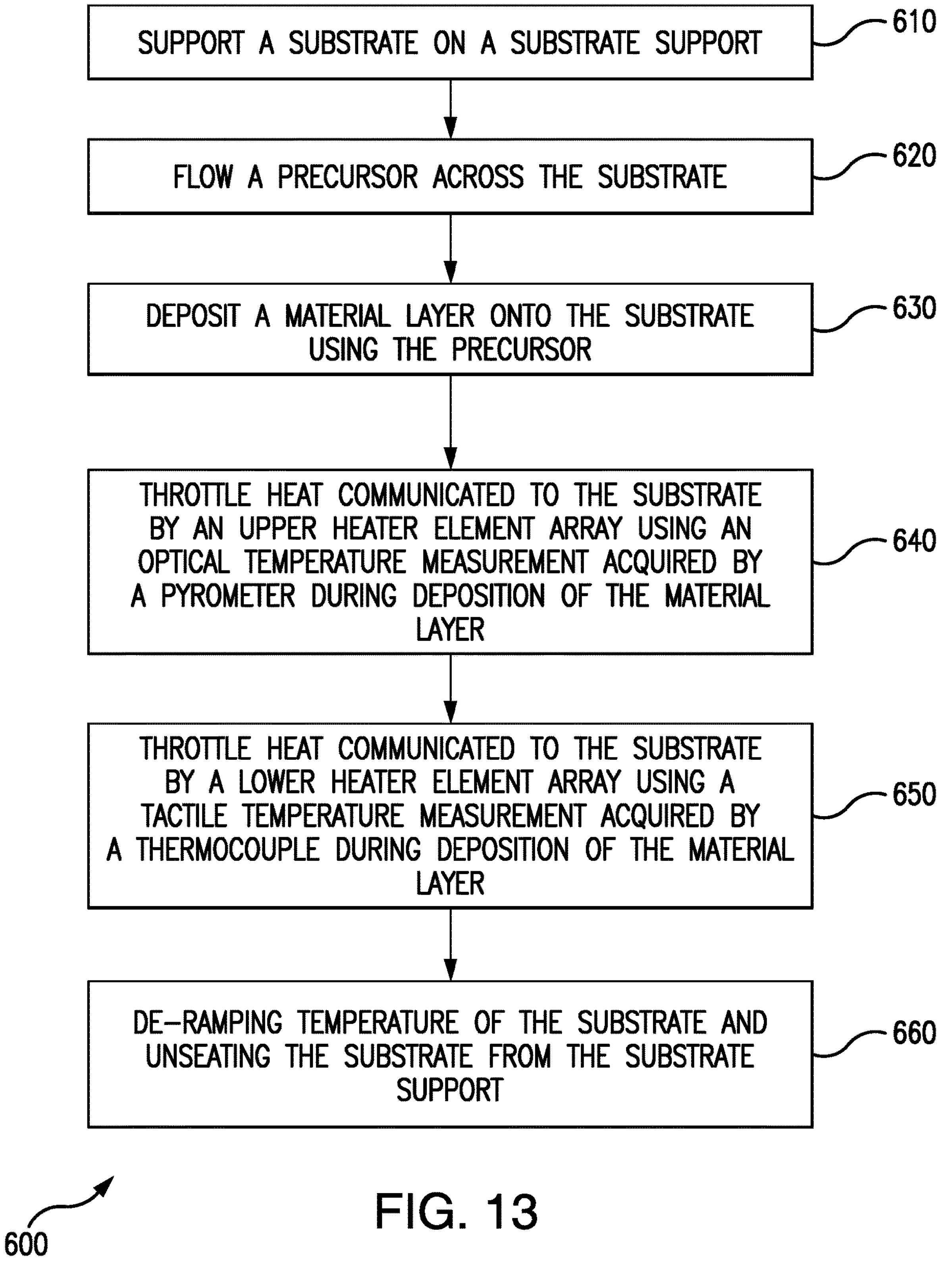
Figure 14:
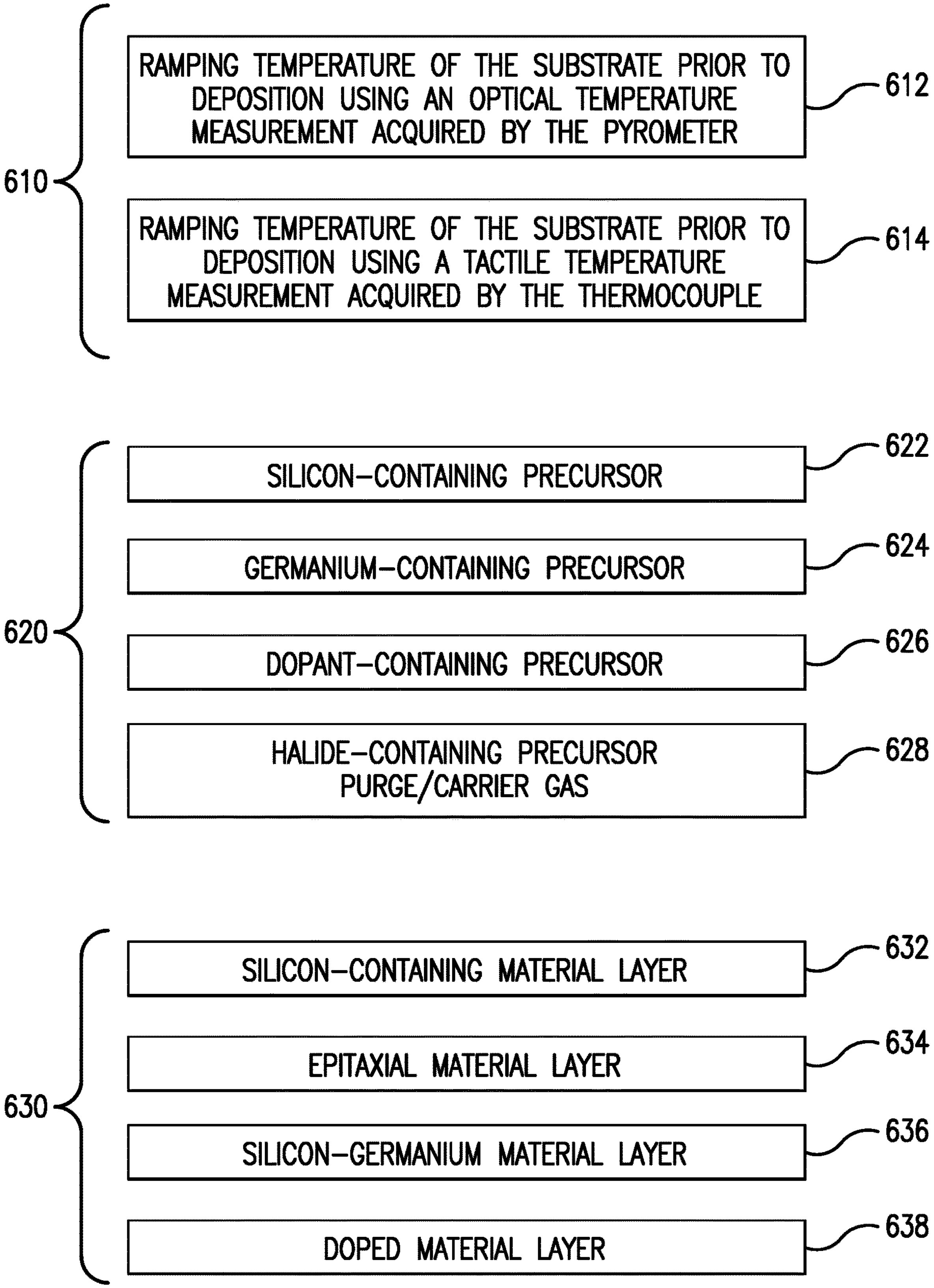
Figure 15:
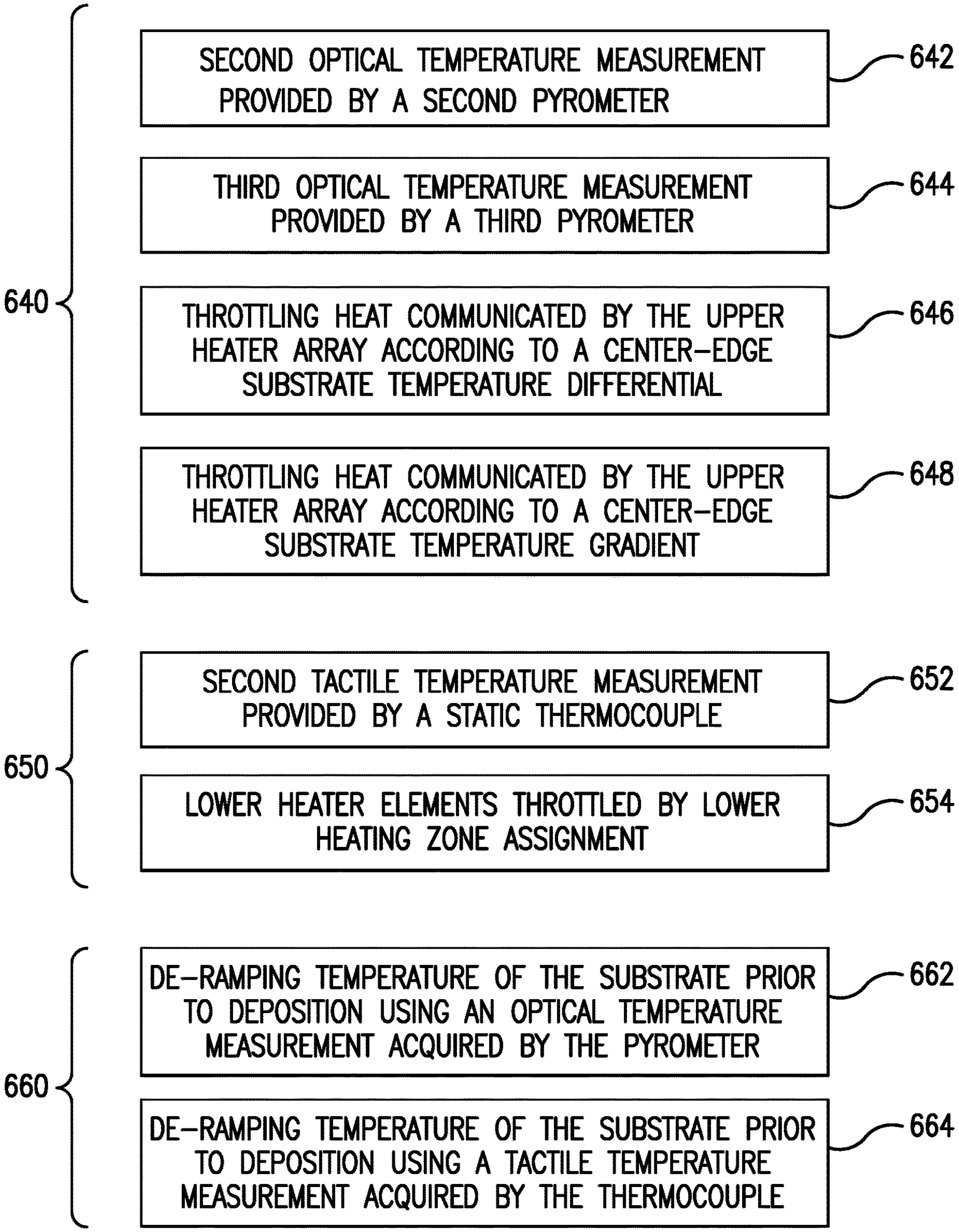

FIGS. 11 and 12 are schematic side and top views of the chamber arrangement of FIG. 1 according to a fifth example of the present disclosure, showing a pyrometer and static pyrometers operatively connected to an upper heater element and a lower heater element arrays of the chamber arrangement according to the second example of the present disclosure; and FIGS. 13-15 are a block diagram of an example of a material layer deposition method in accordance with the present disclosure, showing operations of the method according to an illustrative and non-limiting example of the present disclosure.

It will be appreciated that elements in the figures are illustrated for simplicity and clarity and have not necessarily been drawn to scale. For example, the relative size of some of the elements in the figures may be exaggerated relative to other elements to help improve understanding of illustrated embodiments of the present disclosure.

DETAILED DESCRIPTION OF EXEMPLARY EMBODIMENTS

Reference will now be made to the drawings wherein like reference numerals identify similar structural features or aspects of the subject disclosure. For purposes of explanation and illustration, and not limitation, a partial view of an example of a chamber arrangement in accordance with the present disclosure is shown in FIG. 1 and is designated generally by reference character 100. Other examples of chamber arrangements, semiconductor processing systems, and methods of depositing material layers onto substrates in accordance with the present disclosure, or aspects thereof, are provided in FIGS. 2-15, as will be described. The systems and methods of the present disclosure can be used to control one or more of substrate temperature during the deposition of material layers onto substrates, such as during the deposition of epitaxial material layers onto substrates during the fabrication of semiconductor devices, though the present disclosure is not limited to epitaxial material layers or to the fabrication of any particular type of semiconductor device.

With reference to FIG. 1, a semiconductor processing system 10 is shown. The semiconductor processing system 10 includes a precursor delivery arrangement 12, the chamber arrangement 100, and an exhaust arrangement 14. The precursor delivery arrangement 12 is connected to the chamber arrangement 100 and is configured to provide a precursor 16 to the chamber arrangement 100. The chamber arrangement 100 is connected to the exhaust arrangement 14 and is configured to deposit a material layer 4 onto a substrate 2 supported within the chamber arrangement 100 using the precursor 16. The exhaust arrangement 14 is in fluid communication with the environment 18 external to the semiconductor processing system 10 and is configured to communicate a flow of residual precursor and/or reaction products 20 to the environment 18 external to the semiconductor processing system 10.

As used herein, the term "substrate" may refer to any underlying material or materials that may be used, or upon which, a device, a circuit, or a film may be formed. The "substrate" may be continuous or non-continuous; rigid or flexible; solid or porous. The substrate may be in any form such as a powder, a plate, or a workpiece. Substrates in the form of a plate may include wafers, e.g., 300-millimeter silicon wafers, in various shapes and sizes. Substrates may be made from materials such as silicon, silicon germanium, silicon oxide, gallium arsenide, gallium nitride and silicon carbide by way of non-limiting example. A continuous substrate may extend beyond the bounds of a process chamber where a deposition process occurs and may move through the process chamber such that the process continues until the end of the substrate is reached. A continuous substrate may be supplied from a continuous substrate feeding system, enabling manufacture and output of the continuous substrate in any appropriate form.

Figure 2:
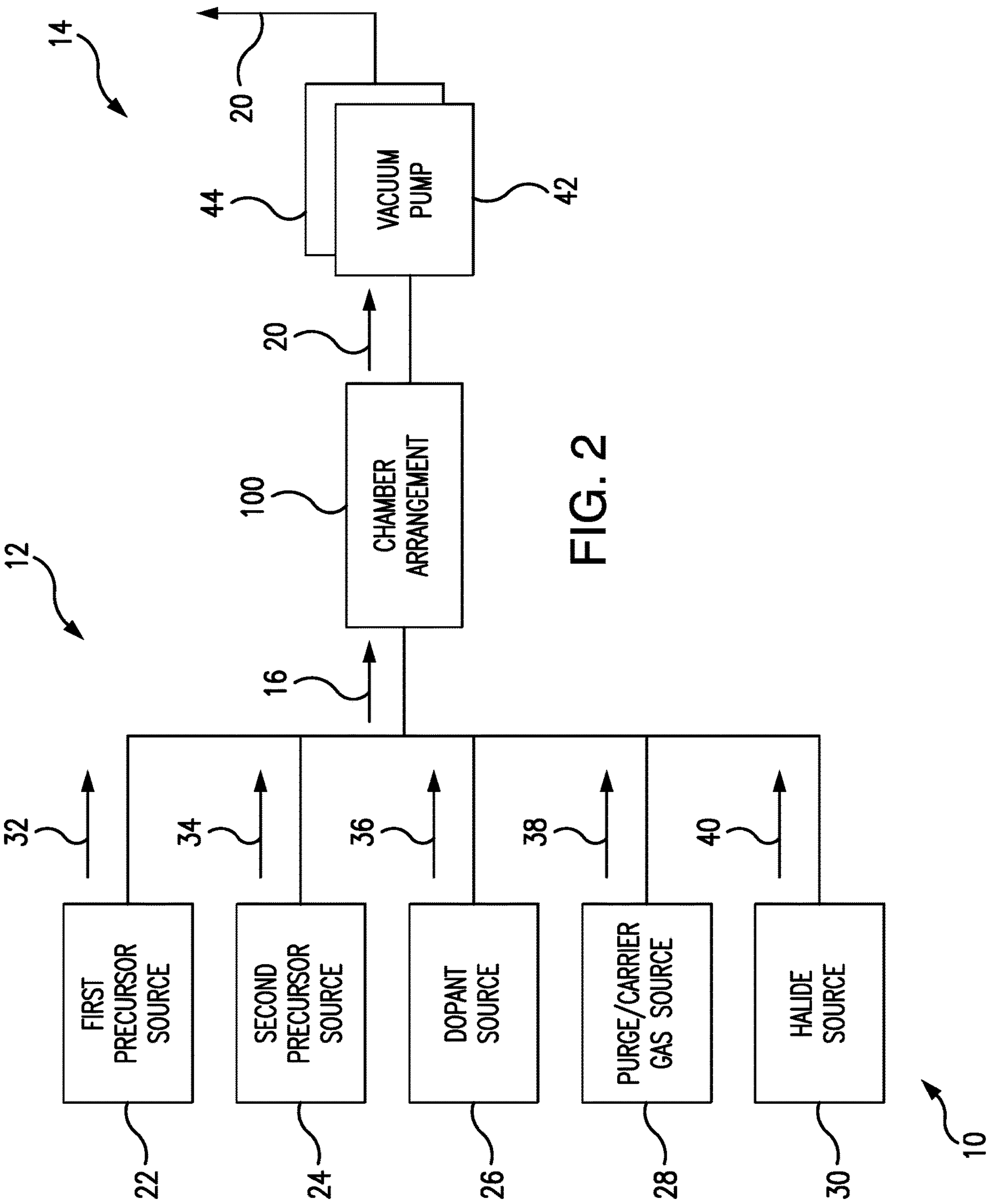
FIG. 2 is a schematic view of the semiconductor processing system of FIG. 1 according to an example of the present disclosure, showing the precursor delivery arrangement providing a precursor to the chamber arrangement and the exhaust arrangement receiving a flow of residual precursor and/or reaction products issued by the chamber arrangement.

With reference to FIG. 2, the precursor delivery arrangement 12 and the exhaust arrangement 14 are shown. The precursor delivery arrangement 12 includes a first precursor source 22, a second precursor source 24, and a dopant source 26. The precursor delivery arrangement 12 also includes a purge/carrier gas source 28 and a halide source 30. The first precursor source 22 is connected to the chamber arrangement 100, includes a silicon-containing precursor 32, and is configured to provide a flow of the silicon-containing precursor 32 to the chamber arrangement 100. Non-limiting examples of suitable silicon-containing precursors include chlorinated silicon-containing precursors, such as dichlorosilane ($H_2SiCl_2$) and trichlorosilane ($HCl_3Si$), and non-chlorinated silicon-containing precursors, such as silane ($SiH_4$) and disilane ($Si_2H_6$).

The second precursor source 24 is connected to the chamber arrangement 100, includes a germanium-containing precursor 34, and is configured to provide a flow of the germanium-containing precursor 34 to the chamber arrangement 100. Examples of suitable germanium-containing precursors include germane ($GeH_4$). The dopant source 26 is similarly connected to the chamber arrangement 100, includes a dopant-containing precursor 36, and is further configured to provide a flow to the dopant-containing precursor 36 to the chamber arrangement 100. In certain examples the dopant-containing precursor 36 may include phosphorous (P). It is also contemplated that the dopant-containing precursor 36 may include boron (B) and/or arsenic (As) and remain within the scope of the present disclosure.

The purge/carrier gas source 28 is further connected to the chamber arrangement 100, includes a purge/carrier gas 38, and is additionally configured to provide a flow of the purge/carrier gas 38 to the chamber arrangement 100. In this respect the purge/carrier gas source 28 may be configured to employ the purge/carrier gas 38 to carry one or more of the silicon-containing precursor 32, the germanium-containing precursor 34, and/or the dopant-containing precursor 36 into the chamber arrangement 100. Examples of suitable purge/carrier gases include hydrogen (H 2) gas, inert gases such as argon (Ar) gas or helium (He) gas, and mixtures thereof.

The halide source 30 is connected to the chamber arrangement 100, includes a halide-containing material 40, and is configured to provide a flow of the halide-containing material 40 to the chamber arrangement 100. The halide-containing material 40 may be co-flowed with the precursor 16. The halide-containing material 40 may be flowed independently from the precursor 16, such as to provide a purge and/or to remove condensate from within the chamber arrangement 100. Examples of suitable halides include chlorine (Cl), e.g., chlorine ($Cl_2$) gas and hydrochloric (HCl) acid, as well as fluorine (F), e.g., fluorine ($F_2$) gas and hydrofluoric (Hf) acid.

The exhaust arrangement 14 is configured to evacuate the chamber arrangement 100 and in this respect may include one or more vacuum pump 42 and/or an abatement apparatus 44. The one or more vacuum pump 42 may be connected to the chamber arrangement 100 and configured to control pressure within the chamber arrangement 100. The abatement apparatus 44 may be connected to the one or more vacuum pump 42 and configured to process the flow a residual precursor and/or reaction products 20 issued by the chamber arrangement 100. It is contemplated that the exhaust arrangement 14 may be configured to maintain environmental conditions within the chamber arrangement 100 suitable for atmospheric deposition operations, such as pressures between about 500 torr and about 760 torr, such as during the deposition of epitaxial material layers including silicon during atmospheric pressure techniques. The exhaust arrangement 14 may also be configured to maintain environmental condition within the exhaust arrangement 14 suitable for reduced pressure deposition operations, such as pressures between about 3 torr and about 500 torr, such as during the deposition of epitaxial material layers including using reduced pressure techniques.

Figure 3:
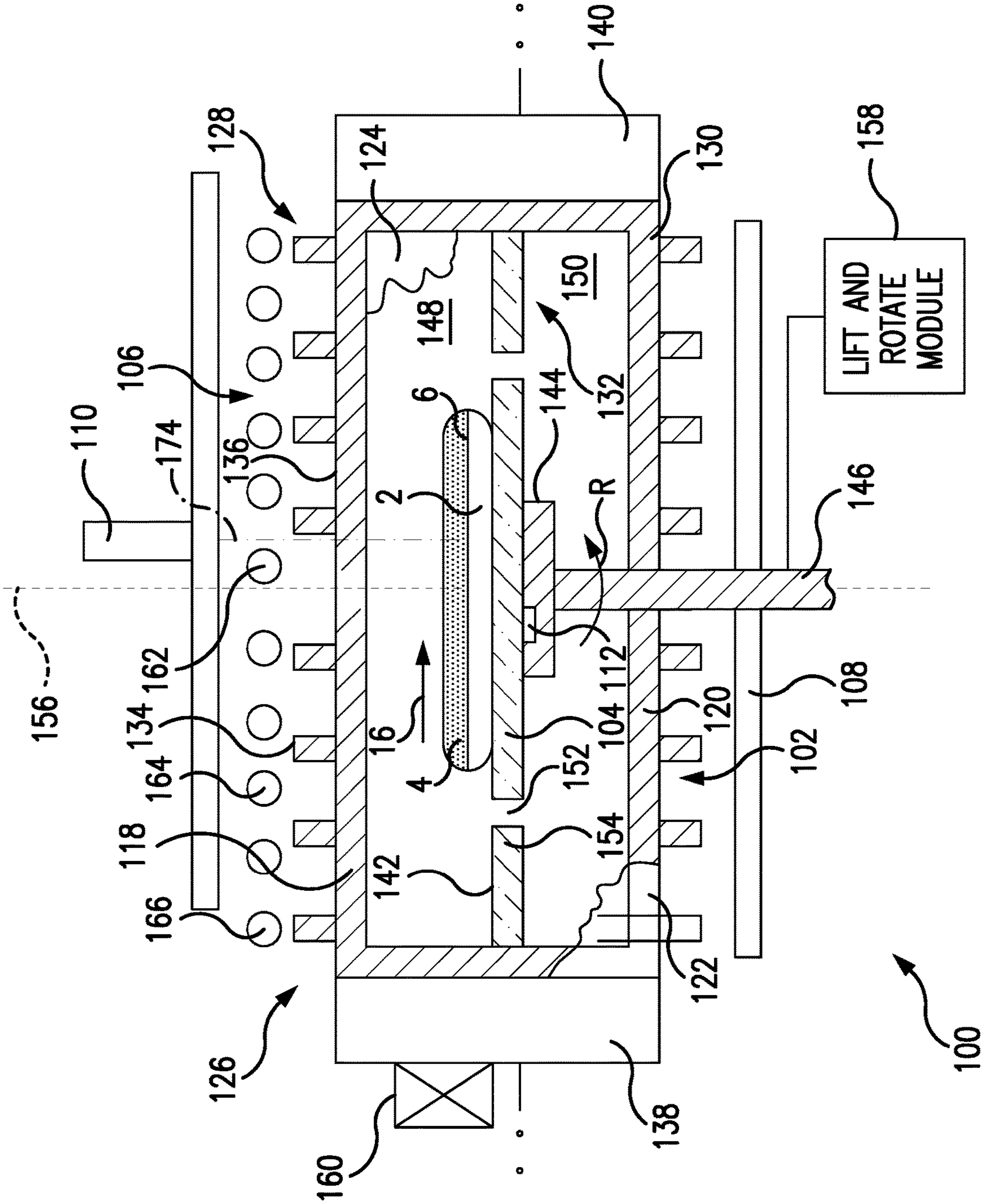
FIGS. 3 and 4 are schematic side and top views of the chamber arrangement of FIG. 1 according to a first example of the present disclosure, showing a pyrometer and a thermocouple operatively connected to an upper heater element and a lower heater element arrays of the chamber arrangement according to the first example of the present disclosure.

With reference to FIG. 3, the chamber arrangement 100 is shown. The chamber arrangement 100 includes a chamber body 102 and a substrate support 104. The chamber arrangement 100 also includes an upper heater element array 106 and a lower heater element array 108. The chamber arrangement 100 further includes a pyrometer 110, a thermocouple 112, a controller 114 (shown in FIG. 4), and a wired or wireless link 116 (shown in FIG. 4). Although a specific arrangement is shown and described herein it is to be understood and appreciated that the chamber arrangement

100 may include other elements and/or omit elements shown and described herein and remain within the scope of the present disclosure.

The chamber body 102 is configured to flow the precursor 16 across the substrate 2 and has an upper wall 118, a lower wall 120, a first sidewall 122, and a second sidewall 124. The upper wall 118 extends longitudinally between an injection end 126 and a longitudinally opposite exhaust end 128 of the chamber body 102, is supported horizontally relative to gravity, is formed from a transmissive material 130. The lower wall 120 is below and parallel relative to the upper wall 118 of the chamber body 102, is spaced apart from the upper wall 118 by an interior 132 of the chamber body 102, and is also formed from the transmissive material 130. The first sidewall 122 longitudinally spans the injection end 126 and the exhaust end 128 of the chamber body 102, extends vertically between the upper wall 118 and the lower wall 120 of the chamber body 102, and is formed from the transmissive material 130. The second sidewall 124 is parallel to the first sidewall 122, is laterally opposite and spaced apart from the first sidewall 122 by the interior 132 of the chamber body 102, and is further formed from the transmissive material 130. In certain examples, the transmissive material 130 may include a ceramic material such as sapphire or quartz. In accordance with certain examples, the chamber body 102 may include a plurality of external ribs 134. The plurality of external ribs 134 may extend laterally about an exterior 136 of the chamber body 102 and be longitudinally spaced between the injection end 126 and the exhaust end 128 of the chamber body 102. In certain examples, the one or more of the walls 118-124 may be substantially planar. In accordance with certain examples, one or more of the walls 118-124 may be arcuate or dome-like in shape. It is also contemplated that, in accordance with certain examples, the chamber body 102 may include no ribs.

An injection flange 138 and an exhaust flange 140 may be connected to the injection end 126 and the exhaust end 128, respectively, of the chamber body 102. The injection flange 138 may fluidly couple the precursor delivery arrangement 12 (shown in FIG. 1) to the interior 132 of the chamber body 102 and be configured to provide the precursor 16 to the interior 132 of the chamber body 102. The exhaust flange 140 may fluidly couple the interior 132 of the chamber body 102 to the exhaust arrangement 14. The exhaust flange 140 may be configured to communicate the residual precursor and/or reaction products 20 (shown in FIG. 1) issued by the chamber arrangement 100 during deposition of the material layer 4 onto the substrate 2. In this respect the chamber body 102 may have a cold wall, cross-flow reactor configuration.

A divider 142, a support member 144, and a shaft member 146 may be arranged within the interior 132 of the chamber body 102. The divider 142 may be fixed within the interior 132 of the chamber body 102 and divide the interior 132 of the chamber body 102 into an upper chamber 148 and a lower chamber 150. The divider 142 may further define an aperture 152 therethrough, the aperture 152 fluidly coupling the upper chamber 148 of the chamber body 102 to the lower chamber 150 of the chamber body 102. The divider 142 may be formed from an opaque material 154. The opaque material 154 may include silicon carbide.

The substrate support 104 may be configured to seat thereon the substrate 2 and supported at least partially within the aperture 152 for rotation R about a rotation axis 156. The substrate support 104 may seat the substrate 2 such that a radially-outer peripheral of the substrate 2 abuts the substrate support 104 while a radially-inner central portion of the substrate 2 is spaced apart from the substrate support 104. The support member 144 may be arranged below the substrate support 104 and along the rotation axis 156. The support member 144 may be further arranged within the lower chamber 150 of the chamber body 102, and fixed in rotation relative to the substrate support 104 about the rotation axis 156 for rotation with the substrate support 104. The substrate support 104 may be formed from an opaque material, such as the opaque material 154 or a graphite material. The support member 144 may be formed from a transmissive material, such as the transmissive material 130.

The shaft member 146 may be arranged along the rotation axis 156 and fixed in rotation relative to the support member 144 about the rotation axis 156. The shaft member 146 may also extend through the lower chamber 150 of the chamber body 102 and through lower wall 120 of chamber body 102. The shaft member 146 may further operably connect a lift and rotate module 158 to the substrate support 104, the lift and rotate module 158 in turn configured to rotate R the substrate support 104 and the substrate 2 about the rotation axis 156 during deposition of the material layer 4 onto an upper surface 6 of the substrate 2. The lift and rotate module 158 may further cooperate with a gate valve 160 and a lift pin arrangement to seat and unseat the substrate 2 from the substrate support 104, such as through a substrate handling robot arranged within a cluster-type platform in selective communication with the interior 132 of the chamber body 102 through the gate valve 160. In certain examples the shaft member 146 may be formed from a transmissive material, such as the transmissive material 130.

The upper heater element array 106 is configured to heat the substrate 2 and/or the material layer 4 during deposition onto the substrate 2 by radiantly communicating heat into the upper chamber 148 of the chamber body 102. In this respect the upper heater element array 106 may include a first upper heater element 162, a second upper heater element 164, and at least one third upper heater element 166. The first upper heater element 162 may include a linear filament and a quartz tube enclosing the linear filament and/or may include one or more bulb or lamp-type heater elements. The first upper heater element 162 may be supported above the upper wall 118 of the chamber body 102, extend laterally between the first sidewall 122 and the second sidewall 124 of the chamber body 102, and may further overlay the substrate support 104. The second upper heater element 164 and the at least one third upper heater element 166 may be similar to the first upper heater element 162, may additionally be longitudinally spaced apart from the first upper heater element 162, and may further be longitudinally spaced apart from the rotation axis 156. The second upper heater element 164 may further overlay (e.g., intersect) a peripheral edge of the substrate 2. The at least one third upper heater element 166 may overlay the divider 142. In certain examples, the upper heater element array 106 may include eleven (11) or twelve (12) upper heater elements. Each upper heater element of the upper heater element array 106 may be longitudinally spaced apart from one another above the upper wall 118 of the chamber body 102 between the injection end 126 and the exhaust end 128 of the chamber body 102.

Figure 4:
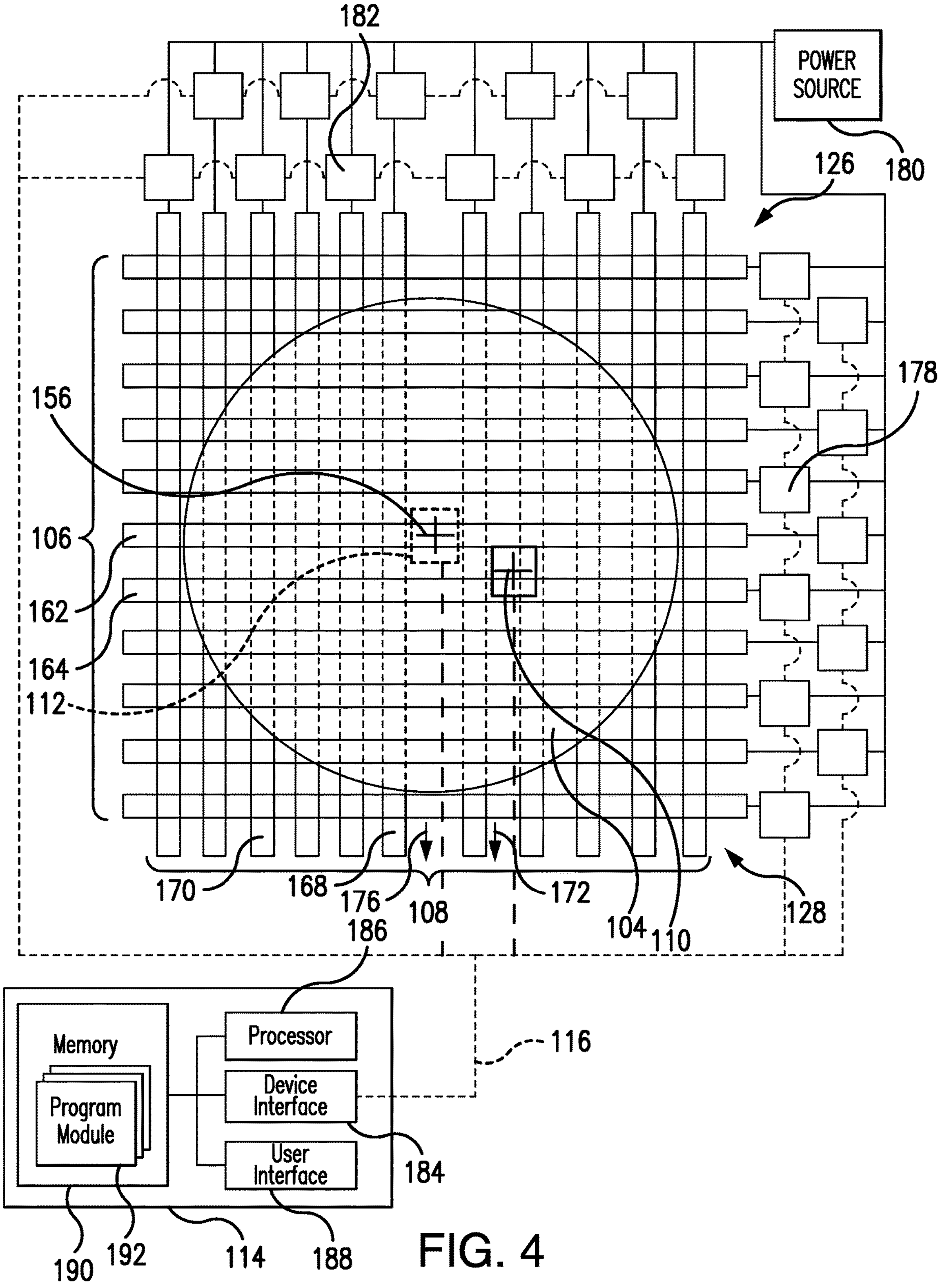

With reference to FIG. 4, the lower heater element array 108 is similar to the upper heater element array 106 and is also configured to heat the substrate 2 (shown in FIG. 1) and/or the material layer 4 (shown in FIG. 1) during deposition onto the substrate 2. In this respect the lower heater element array 108 may be configured to communicate radiant heat into the lower chamber 150 (shown in FIG. 3)

of the chamber body 102 (shown in FIG. 3) to the substrate support 104 (shown in FIG. 3) and the divider 142 (shown in FIG. 3). The substrate support 104 and the divider 142 may in turn heat the substrate 2 by conducting the heat through the bulk material forming the substrate support 104 and the divider 142, radiant heat communicated into the lower chamber 150 by the lower heater element array 108 thereby being conducted to the substrate 2. The lower heater element array 108 may include a first lower heater element 168 and at least one second lower heater element 170.

The first lower heater element 168 is similar to the first upper heater element 162 and is additionally supported below the lower wall 120 (shown in FIG. 3) of the chamber body 102 (shown in FIG. 3). The first lower heater element 168 further extends longitudinally between the injection end 126 (shown in FIG. 3) and the exhaust end 128 (shown in FIG. 3) of the chamber body 102. The first lower heater element 168 may further be substantially orthogonal relative to the first upper heater element 162 of the upper heater element array 106. The at least one second lower heater element 170 may be parallel to the first lower heater element 168 and laterally spaced apart from the first lower heater element 168 below the lower wall 120 (shown in FIG. 3) of the chamber body 102. In certain examples, the first lower heater element 168 may underlie the substrate support 104. In accordance with certain examples, the at least one second lower heater element 170 may underlie the divider 142 (shown in FIG. 3). It is also contemplated that, in accordance with certain examples, the lower heater element array 108 may include eleven (11) or twelve (12) lower heater elements each laterally spaced apart from one another below the lower wall 120 of the chamber body 102.

The pyrometer 110 is configured to acquire an optical temperature measurement 172 using electromagnetic radiation emitted by the substrate 2 (shown in FIG. 1) and/or the material layer 4 (shown in FIG. 1). In this respect the pyrometer 110 is supported above the upper wall 118 (shown in FIG. 3) of the chamber body 102 (shown in FIG. 3) and is arranged along an optical axis 174 (shown in FIG. 3). More specifically, the pyrometer 110 is supported above the upper heater element array 106 and arranged longitudinally between the injection end 126 and the exhaust end 128 of the chamber body 102 such that the optical axis 174 may extend between the first upper heater element 162 and the second upper heater element 164. The optical axis 174 may further intersect the substrate support 104. The optical axis 174 may intersect the substrate 2 when seated on the substrate support 104, the optical temperature measurement 172 thereby acquired directly from the upper surface 6 of the substrate 2 and/or the material layer 4 during deposition onto the substrate 2 by pyrometer 110. In certain examples, the optical axis 174 may be coaxial with the rotation axis 156. In accordance with certain examples, the pyrometer 110 may at least one of longitudinally offset and/or laterally offset from the rotation axis 156, e.g., radially offset from the rotation axis 156. As will be appreciated by those of skill in the art in view of the present disclosure, offsetting the optical axis 174 from the rotation axis 156 may facilitate packaging the pyrometer 110 above the chamber body 102. Examples of suitable pyrometers include OR400M optical infrared pyrometers, available from the Advanced Energy Corporation of Denver, Colorado.

The thermocouple 112 may be configured to acquire temperature of the substrate support 104 and provide a tactile temperature measurement 176 indicative of temperature of the substrate support 104. In this respect the thermocouple 112 may be arranged within the interior 132 (shown in FIG. 3) of the chamber body 102 (shown in FIG. 3). More specifically, the thermocouple 112 may be arranged within the lower chamber 150 (shown in FIG. 3) of the chamber body 102 and fixed in rotation R relative to the substrate support 104. Specifically, the thermocouple 112 may be in intimate mechanical contact (e.g., abut) contact with a lower surface of the substrate support 104. The thermocouple 112 may be arranged along the rotation axis 156. The thermocouple 112 may be offset from the rotation axis 156, for example radially offset from the rotation axis 156, such that the thermocouple 112 underlies the pyrometer 110, potentially improving accuracy of either (or both) the optical temperature measurement 172 provided by the pyrometer 110 and a tactile temperature measurement 176 provided by the thermocouple 112. Examples of suitable thermocouples includes those shown and described in U.S. Pat. No. 7,874,726 B2 to Jacobs et al, issued Jan. 25, 2011, the contents of which is incorporated herein by reference in its entirety.

The controller 114 is connected to the upper heater element array 106 and the lower heater element array 108. In this respect the wired or wireless link 116 may connect the controller 114 to the upper heater element array 106 and the lower heater element array 108. In certain examples one or more upper silicon-controlled rectifier (SCR) devices 178 may couple the controller 114 to the upper heater element array 106. In accordance with certain examples, a singular one of the one or more upper SCR device 178 couple each of the upper heater elements of the upper heater element array 106 to both the controller 114 and a power source 180, the controller 114 thereby having discrete control over power applied to each of the upper heater elements of the upper heater element array 106. The lower heater element array 108 may be similarly throttled, one or more lower SCR device 182 coupling the controller 114 to the lower heater elements of the lower heater element array 108. The one or more lower SCR devices 182 may include a singular lower SCR device coupling the each of the lower heater elements of the lower heater element array 108 to both the controller 114 and the power source 180 to provide discrete control over power applied to each of the lower heater elements of the lower heater element array 108.

It is contemplated that the controller 114 be connected to both the pyrometer 110 and the thermocouple 112, for example, by the wired or wireless link 116. In this respect the controller 114 may operatively connect the pyrometer 110 to the upper heater element array 106, power applied to (and thereby radiant heat output from) the upper heater element array 106 throttled according to the optical temperature measurement 172 provided to the controller 114 by the pyrometer 110. The controller 114 may also operatively connect the thermocouple 112 to the lower heater element array 108, power applied to (and thereby radiant heat output) from the lower heater element array 108 be throttled by the tactile temperature measurement 176 provided to the controller 114 by the thermocouple 112.

As will be appreciated by those of skill in the art in view of the present disclosure, throttling heat output of the upper heater element array 106 using the pyrometer 110 and throttling heat output of the lower heater element array 108 may limit (or eliminate) oscillation otherwise cause heating of substrate 2 that could otherwise be associated with lag in arrival of heat from the lower heater element array 108 at the substrate 2 through the thermal mass of the substrate support 104, about the rotation axis 156 the substrate 2 with the pyrometer 110. In certain examples, heat output of the upper heater element array 106 may be exclusively throttled using the optical temperature measurement 172 provided by the pyrometer 110, and heat output of the lower heater element array 108 may be exclusively throttled by the tactile temperature measurement 176 provided by the thermocouple 112. It is also contemplated that hybrid throttling schemes may be employed, e.g., with weighting assignments, and remain within the scope of the present disclosure.

In the illustrated example the controller 114 includes a device interface 184, a processor 186, a user interface 188, and a memory 190. The device interface 184 connect the processor 186 to the wired or wireless link 116. The processor 186 is operably connected to the user interface 188 (e.g., to receive user input and/or provide user output therethrough) and is disposed in communication with the memory 190. The memory 190 includes a non-transitory machine-readable medium having a plurality of program modules 192 recorded thereon containing instructions that, when read by the processor 186, cause the processor 186 to execute certain operations. Among the operations are operations of a material layer deposition method 600 (shown in FIG. 5), as will be described. As will be appreciated by those of skill in the art in view of the present disclosure, the controller 114 may have a different arrangement in other examples and remain within the scope of the present disclosure.

Figure 5:
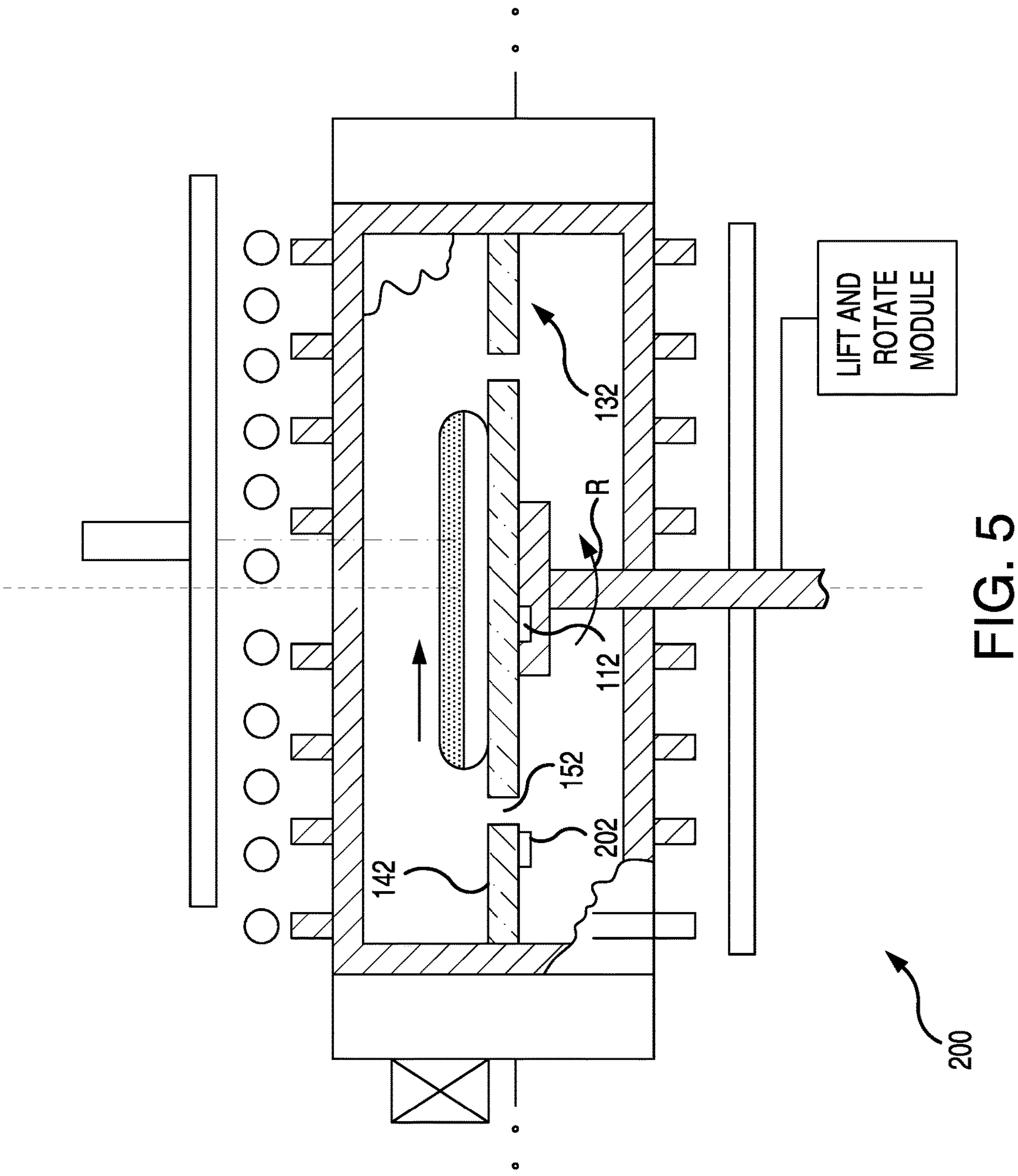
FIGS. 5 and 6 are schematic side and top views of the chamber arrangement of FIG. 1 according to a second example of the present disclosure, showing a pyrometer and thermocouples operatively connected to an upper heater element and a lower heater element arrays of the chamber arrangement according to the second example of the present disclosure.
Figure 6:
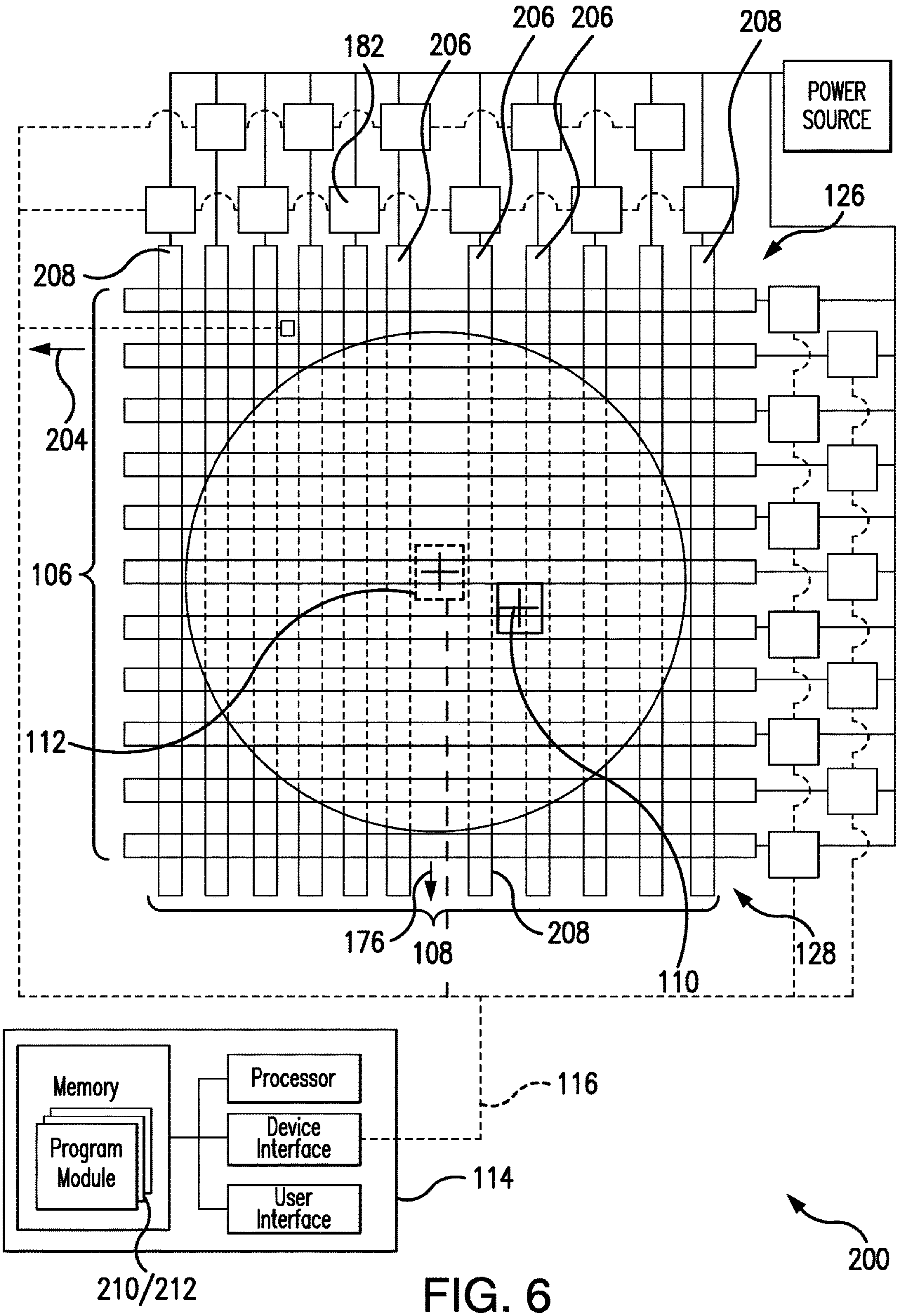

With reference to FIGS. 5 and 6, a chamber arrangement 200 is shown. The chamber arrangement 200 is similar to the chamber arrangement 100 (shown in FIG. 1) and additionally includes a static thermocouple 202, the thermocouple 112 being a rotating thermocouple 112. The static thermocouple 202 is arranged within the interior 132 of chamber body 102 and is fixed relative to the divider 142. More specifically, the static thermocouple 202 is arranged within an interior of the divider 142, is connected to the controller 114, and is configured to provide a second tactile temperature measurement 204 (shown in FIG. 6) to the controller 114. The static thermocouple 202 may be connected to the controller 114 by the wired or wireless link 116, the wired or wireless link 116 in turn communicating the second tactile temperature measurement 204 to the controller 114. In certain examples, the static thermocouple 202 may be one of a plurality of static thermocouples fixed on or within the interior of the divider 142 and distributed circumferentially about the aperture 152.

In the illustrated example the controller 114 may be configured to throttle heat output of the lower heater element array 108 using both the first tactile temperature measurement 176 and the second tactile temperature measurement 204. In this respect the controller 114 may (a) assign the first lower heater element 168 to a first lower heating zone 206, (b) assign the at least one second lower heater element 170 to a second lower heating zone 208, (c) throttle heat output of the first lower heater element 168 using the first tactile temperature measurement 176 and a first lower heating zone target 210, and (d) throttle heat output of the at least one second lower heater element 170 using the second lower heating zone target 212. It is contemplated that the controller 114 throttle power applied to the first lower heater element 168 independently of power applied the at least one second lower heater element 170 using the first tactile temperature measurement 176 and the second tactile temperature measurement 204. For example, the first lower heating zone target 210 may be equivalent to (or different than) the second lower heating zone target 212. Independent throttling of heat generated may be accomplished, for example, using the lower SCR devices 182. In this respect the lower heater element array 108 may be disconnected from the pyrometer 110 by the controller 114, and the upper heater element array 106 may be further disconnected from the thermocouple 112 by the controller 114.

In certain examples, a plurality of lower heater elements (e.g., five (5) or more lower heater elements) of the lower heater element array 108 may be assigned to the first lower heating zone 206 and throttled using the first tactile temperature measurement 176. In accordance with certain examples, six (6) or more lower heater elements of the lower heater element array 108 with the first lower heater element 168 interposed therebetween may be assigned to the second lower heating zone 208 and throttled using the second tactile temperature measurement 204. As will be appreciated by those of skill in the art in view of the present disclosure, throttling heat generated by the lower heater elements underlying the divider 142 using the static thermocouple 202 while throttling heat generated by the lower heater elements underlying the substrate support 104 using the rotating thermocouple 112 may limit cross talk in changes made to heat output by the upper heater element array 106 and the lower heater element array 108 associated with a gap defined between the substrate support 104 and the divider 142, limiting (or eliminating) thickness variation in the material layer 4 induced during deposition that may otherwise associated with temperature variation associated with the lag.

Figure 7:
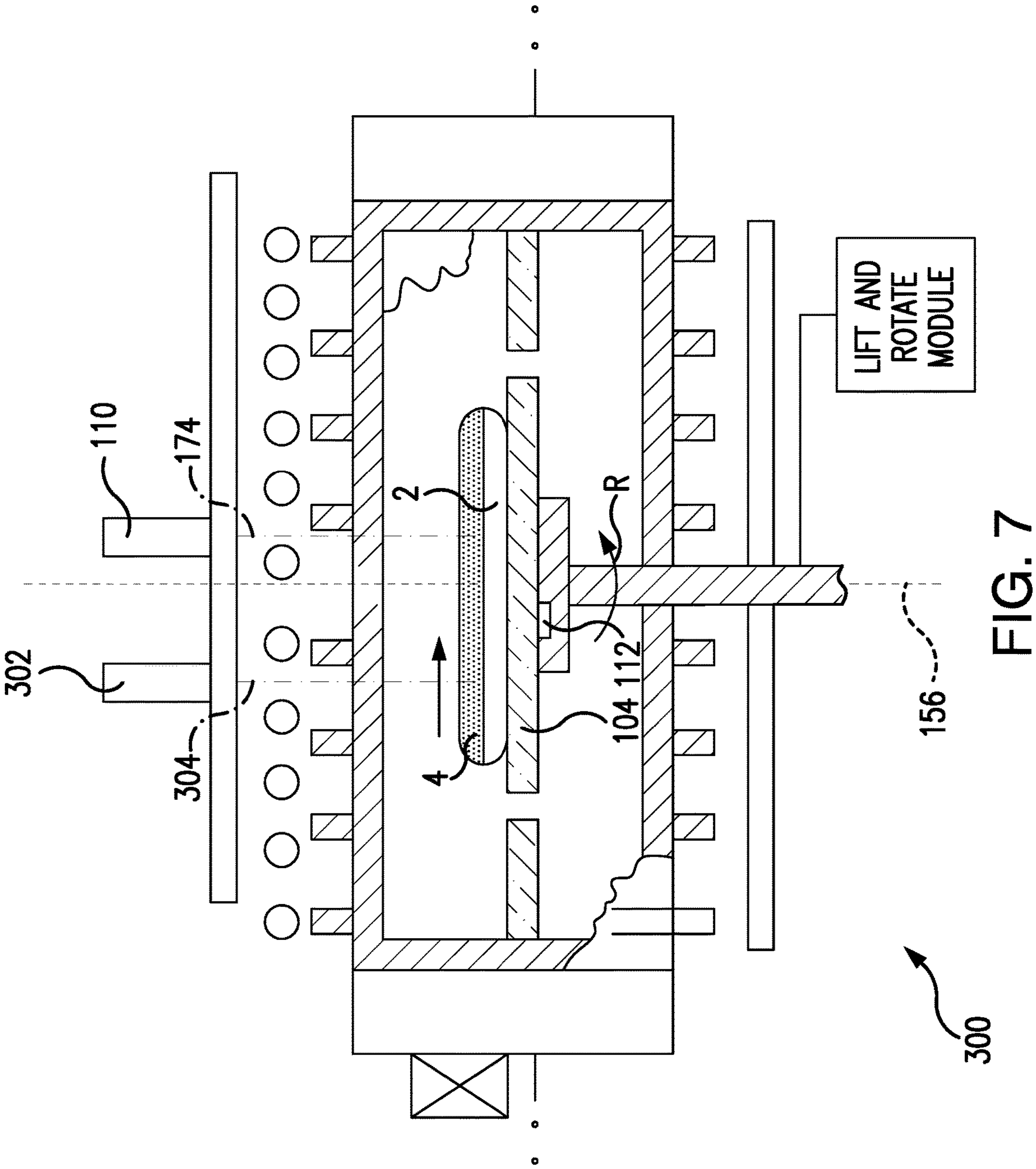
FIGS. 7 and 8 are schematic side and top views of the chamber arrangement of FIG. 1 according to a third example of the present disclosure, showing two pyrometers and a thermocouple operatively connected to an upper heater element and a lower heater element arrays of the chamber arrangement according to the third example of the present disclosure.
Figure 8:
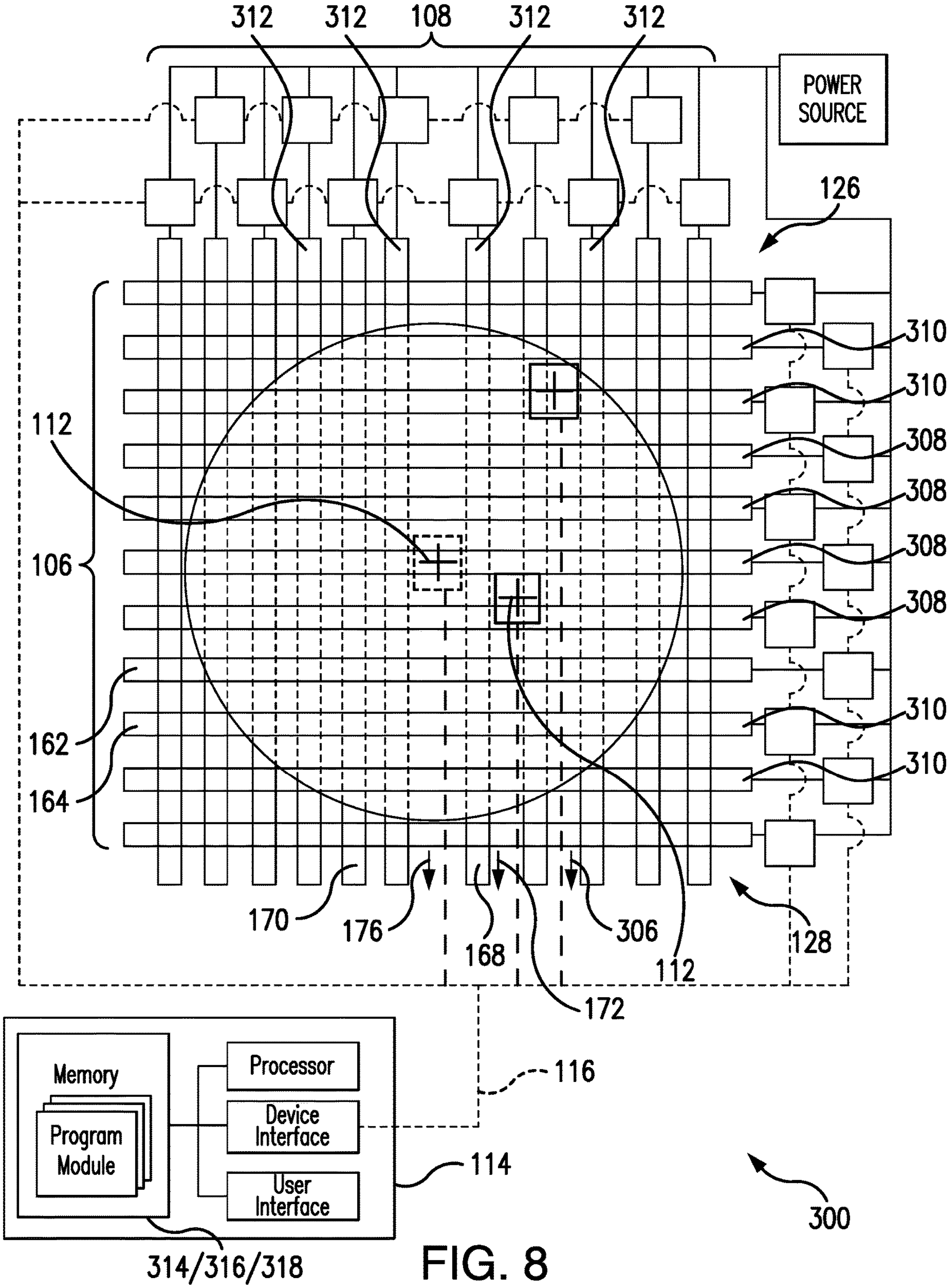

With reference to FIGS. 7 and 8, a chamber arrangement 300 is shown. The chamber arrangement 300 is similar to the chamber arrangement 100 (shown in FIG. 1) and additionally includes a second pyrometer 302. The second pyrometer 302 is arranged along a second optical axis 304 and is arranged radially outward of the first pyrometer 110 relative to the rotation axis 156. It is contemplated that the second optical axis 304 intersect the substrate support 104. More specifically, the second optical axis 304 may intersect the substrate 2 when seated on the substrate support 104, the second pyrometer 302 thereby configured to receive a second optical temperature measurement 306 of the substrate 2 during deposition of the material layer 4 onto the substrate 2. In certain examples, the second optical axis 304 may be laterally offset from the first optical axis 174. In accordance with certain examples, the second optical axis 304 may be longitudinally offset from the first optical axis 174. It is also contemplated that the second optical axis 304 may be both laterally offset and longitudinally offset from the first optical axis 174.

It is contemplated that the second pyrometer 302 be operatively connected to the upper heater element array 106. In this respect it is contemplated that the first upper heater element 162 be operatively associated with the first pyrometer 110, that the second upper heater element 164 be operatively associated with the second pyrometer 302, and the lower heater element array 108 be operatively associated with the thermocouple 112. In this respect the second pyrometer 302 is connected to the controller 114, for example through the wired or wireless link 116, and configured to provide the second optical temperature measurement 306 to the controller 114. During deposition of the material layer 4 onto the substrate 2 the controller 114 may (a) assign the first upper heater element 162 to a first upper heating zone 308, assign the second upper heater element 164 to a second upper heating zone 310, and assign the first lower heater element 168 and the at least one second lower heater element 170 to a lower heating zone 312; (b) receive the first optical temperature measurement 172 from the first pyrometer 110, receive the second optical temperature measurement 306 from the second pyrometer 302, and receive the tactile temperature measurement 176 from the thermocouple 112; and (c) compare the first optical temperature measurement 172 to a predetermined first upper heating zone target 314, compare the second optical temperature measurement 306 to the a predetermined second upper heating zone target 316, and compare the tactile temperature measurement 176 to a predetermined lower heating zone target 318. When any one of the comparisons is outside of a predetermined differential limit, the controller 114 may (d) change power applied to first upper heater element 162, power applied to the second upper heater element 164, and/or the first lower heater element 168 and the at least one second lower heater element 170 based on the differential.

In certain examples, each of the upper heater elements of the upper heater element array 106 may be distributed into the first upper heating zone 308 and the second upper heating zone 310. For example, a plurality of upper heater elements (e.g., five (5) or more upper heater elements) of the upper heater element array 106 may be assigned to the first upper heating zone 308 and throttled using the first optical temperature measurement 172, and five (5) or more upper heater elements including the second upper heater element 164 may be assigned to the second upper heating zone 310 and throttled using the second optical temperature measurement 306. In accordance with certain examples, each of the lower heater elements may be assigned to the lower heating zone 312 and throttled using the tactile temperature measurement 176 provided by the thermocouple 112. In this respect each of eleven (11) or twelve (12) lower heater elements included in the lower heater element array 108 may be assigned to the lower heating zone 312.

As will be appreciated by those of skill in the art in view of the present disclosure, in addition to the aforementioned advantages relating to limiting feedback associated with changes made to heat output from lower heater elements assigned to the lower heater element array 108, assigning the upper heater elements into the first upper heating zone 308 and the second upper heating zone 310 allows for controlling temperature variation between the center and the edge of the substrate 2. For example, a predetermined first upper heating zone target 314 may be assigned to the first upper heating zone 308, a predetermined second upper heating zone target 316 may be assigned to the second upper heating zone 310, and a temperature difference between the center and the edge of the substrate 2 limited (or a non-zero differential maintained) during deposition of the material layer 4 onto the upper surface 6 of the substrate 2. Driving a temperature differential across the substrate 2 using the first optical temperature measurement 172 and the second optical temperature measurement 306 may, in certain examples, may be employed as a countermeasure to an edge roll-up or edge roll-down material layer profile otherwise characteristic of the material layer deposition process employed in the chamber arrangement 300.

Figure 9:
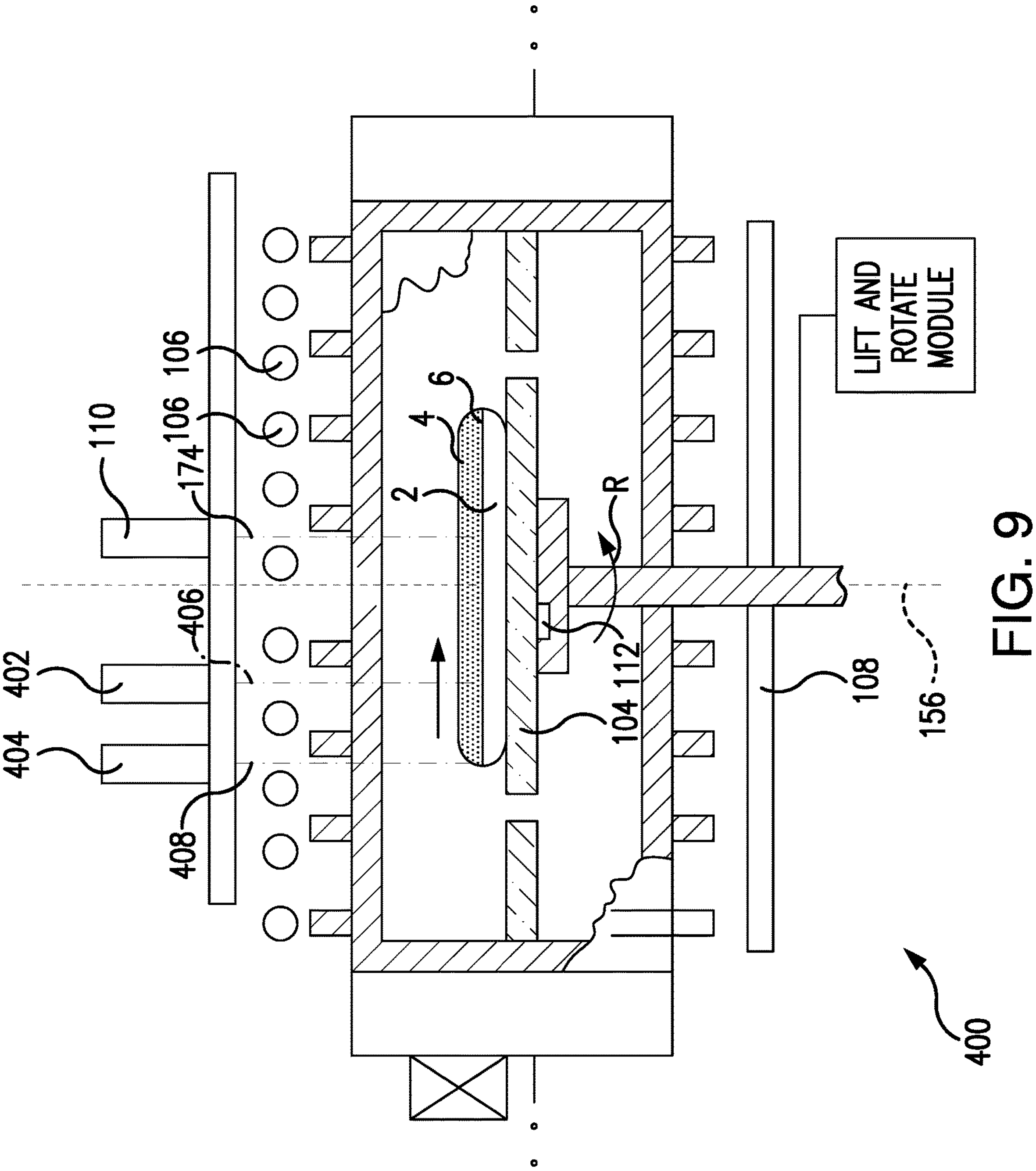
FIGS. 9 and 10 are schematic side and top views of the chamber arrangement of FIG. 1 according to a fourth example of the present disclosure, showing three pyrometers and a thermocouple operatively connected to an upper heater element and a lower heater element arrays of the chamber arrangement according to the fourth example of the present disclosure.
Figure 10:
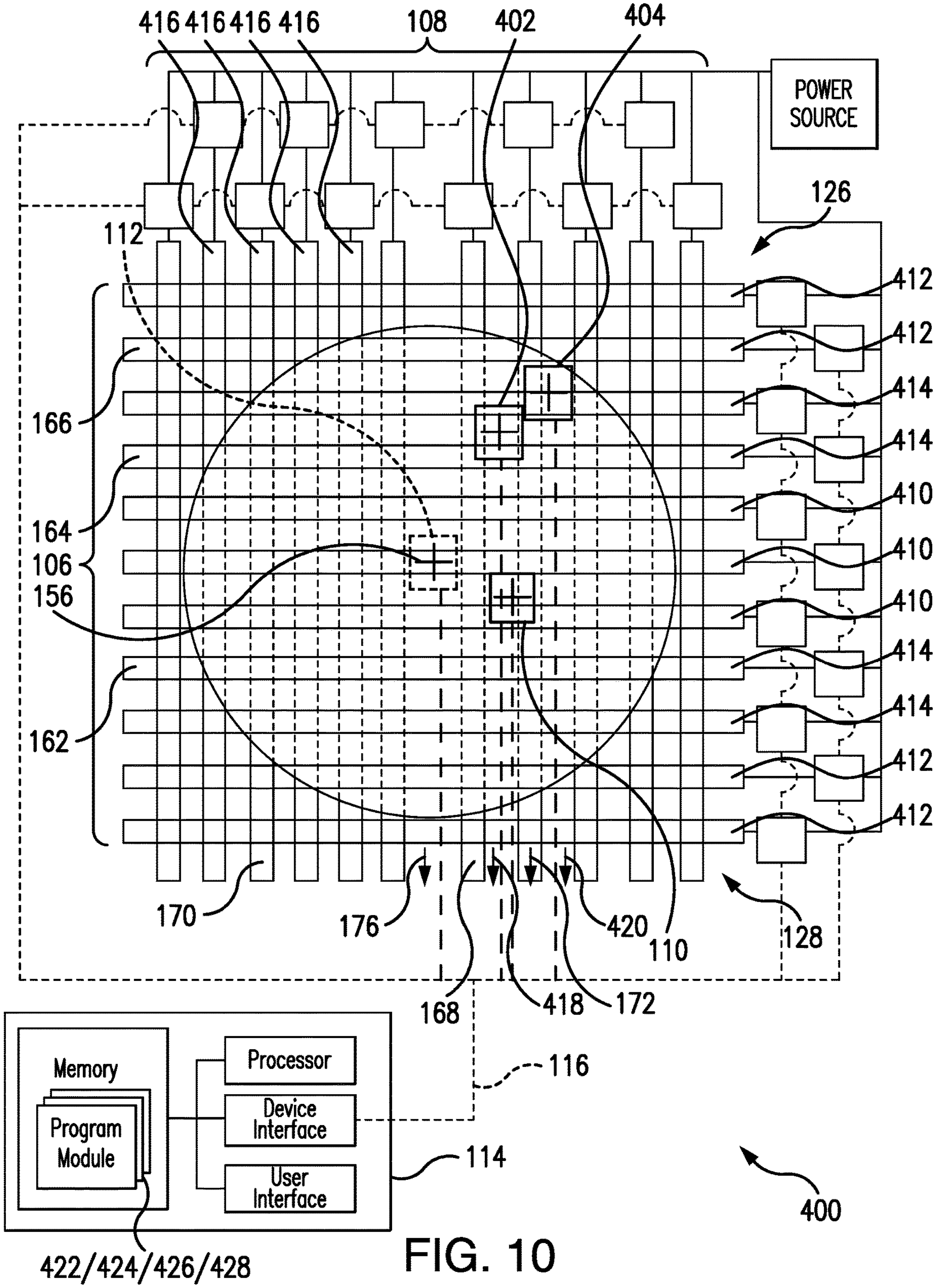

With reference to FIGS. 9 and 10, a chamber arrangement 400 is shown. The chamber arrangement 400 is similar to the chamber arrangement 100 (shown in FIG. 1) and additionally includes a second pyrometer 402 and a third pyrometer 404. The second pyrometer 402 is supported above the upper heater element array 106 and along a second optical axis 406. The second optical axis 406 is radially outwards of the first optical axis 174, overlays the substrate support 104, and intersects the substrate 2 when the substrate 2 is seated on the substrate support 104. The second optical axis 406 may be parallel to the first optical axis 174 and may further extend between the first upper heater element 162 and the at least one third upper heater element 166. The third pyrometer 404 is also supported above the upper heater element array 106, is arranged along a third optical axis 408, and may be parallel to the second optical axis 406. The third optical axis 408 is radially intermediate the first optical axis 174 and the second optical axis 406, the third optical axis 408 also overlaying the substrate support 104 and intersecting the substrate 2 when the substrate 2 is seated on the substrate support 104. In certain examples, the second optical axis 406 may be circumferentially offset from the first optical axis 174 about the rotation axis 156. In accordance with certain examples, the third optical axis 408 may be circumferentially offset from the second optical axis 406 about the rotation axis 156. It is also contemplated that, in accordance with certain examples, the third optical axis 408 may be circumferentially offset from both the first optical axis 174 and the second optical axis 406.

It is contemplated that the second pyrometer 402 and the third pyrometer 404 be operatively connected to the upper heater element array 106. In this respect the first pyrometer 110 may be operatively connected to the first upper heater element 162 to throttle power applied to the first upper heater element 162 and communicated into the upper chamber 148 (shown in FIG. 3) of the chamber body 102 (shown in FIG. 3). The second pyrometer 402 may be operatively connected to the second upper heater element 164 to throttle power applied to the second upper heater element 164 and communicated into the upper chamber 148 of the chamber body 102 by the second upper heater element 164. The third pyrometer 404 may be operatively connected to the at least one third upper heater element 166 to throttle heat generated by the at least one third upper heater element 166 and communicated into the upper chamber 148 of the chamber body 102 by the at least one third upper heater element 166. The thermocouple 112 may be operatively connected to the lower heater element array 108 to throttle heat communicated into the lower chamber 150 of the chamber body 102 to throttle heating of the substrate support 104 independent of heating of the substrate 2 by the upper heater element array 106. Operative connection may be through the controller 114. In this respect the first pyrometer 110 and the thermocouple 112 as are connected to the controller 114 by the wired or wireless link 116. In further respect, the second pyrometer 402 and the third pyrometer 404 may also be connected to the controller 114 by the wired or wireless link 116.

The controller 114 may be configured to (a) assign the first upper heater element 162 to a first upper heating zone 410, assign the at least one third upper heater element 166 to a second upper heating zone 412, assign the second upper heater element 164 to a third upper heating zone 414, and assign the first lower heater element 168 and the at least one second lower heater element 170 to a lower heating zone 416. The controller 114 may also be configured to (b) receive the first optical temperature measurement 172 from the first pyrometer 110, receive a second optical temperature measurement 418 from the second pyrometer 402, receive a third optical temperature measurement 420 from the third pyrometer 404, and receive the tactile temperature measurement 176 from the thermocouple 112. It is contemplated that the controller 114 may be further configured to (c) compare the first optical temperature measurement 172 to a predetermined first upper heating zone target 422, compare the second optical temperature measurement 418 to the a predetermined second upper heating zone target 424, compare the third optical temperature measurement 420 with a predetermined third upper heating zone target 426, and compare the tactile temperature measurement 176 to a predetermined lower heating zone target 428 to control heating of the substrate 2. When any one of the comparisons indicates that temperature is outside of a predetermined differential limit, the controller 114 may (d) change power applied to first upper heater element 162, power applied to the at least one third upper heater element 166, change power applied to the second upper heater element 164, and/or the first lower heater element 168 and the at least one second lower heater element 170 based on the differential.

In certain examples, each of the upper heater elements of the upper heater element array 106 may be distributed into one of the first upper heating zone 410, a second upper heating zone 412, and a third upper heating zone 414. For example, three (3) centrally positioned upper heater elements of the upper heater element array 106 may be assigned to the first upper heating zone 410, four (4) of the upper heater elements paired on longitudinally opposite sides of the upper heater elements assigned to the first upper heating zone 410 may be assigned to the second upper heating zone 412, and four (4) of the upper heater elements paired and distributed between the upper heater elements of first upper heating zone 410 and those assigned to the second upper heating zone 412 may be assigned to the third upper heating zone 414. As will be appreciated by those of skill in the art in view of the present disclosure, in addition to the aforementioned advantages relating to limiting feedback associated with changes made to heat output from lower heater elements assigned to the lower heater element array 108, assigning the upper heater elements into the first upper heating zone 410, the second upper heating zone 412, and the third upper heating zone 414 enables control of temperature gradient radially across the upper surface 6 of the substrate 2. Control of temperature gradient in turn enables tuning heat flux radially within the substrate 2, for example, to limit likelihood of crystallographic slip defect development in the material layer 4 due to temperature gradient within the substrate 2.

With reference to FIGS. 11 and 12, a chamber arrangement 500 is shown. The chamber arrangement 500 is similar to the chamber arrangement 100 (shown in FIG. 1) and additionally includes one or more pyrometer 502, a first static thermocouple 504, a second static thermocouple 506, and a rotating thermocouple 508. The one or more pyrometer 502 is supported above the chamber body 102, overlays the substrate support 104, and is optically coupled to the interior 132 of the chamber body 102 along one or more optical axis 510. It is contemplated that the one or more pyrometer 502 be configured to optically acquire temperature of a substrate seated on the substrate support 104 during deposition of a material layer onto the substrate, e.g., during deposition of the material layer 4 onto the substrate 2. It is further contemplated that the one or more pyrometer 502 be connected to the controller 114 (shown in FIG. 4) by the wired or wireless link 116 (shown in FIG. 4) and be disposed in communication with the controller 118 114 to provide an optical temperature measurement 46 to the controller 114 to control temperature of the substrate 2 in real time during deposition of the material layer 4 onto the substrate 2 using temperature measurements acquired using electromagnetic radiation emitted by the substrate 2 and/or the material layer 4 and received by the one or more optical pyrometer 502 along the one or more optical axis 510.

The first static thermocouple 504 and the second static thermocouple 506 are connected to the divider 142. In this respect it is contemplated that the divider 100 142 have an injection portion 194 and an exhaust portion 196. The injection portion 194 of the divider 142 is longitudinally between the substrate support 104 and the injection end 126 of the chamber body 102 and is proximate the injection flange 138, the exhaust portion 196 of the divider 142 is longitudinally separated from the injection portion 194 by substrate support 104 and is proximate the exhaust flange 140, and the first static thermocouple 504 and the second static thermocouple 506 are connected to the injection portion 194 and the exhaust portion 195 196 of the divider 142.

It contemplated that the first static thermocouple 504 be configured to acquire an upstream tactile temperature measurement 48 from the injection portion 194 of the divider 142, that the second static thermocouple 506 be configured to acquire a downstream tactile temperature measurement 50 from the exhaust portion 196 of the divider 142, and that the first static thermocouple 504 and the second static thermocouple 506 be connected to the wired or wireless link 116 to provide the upstream tactile temperature measurement 48 and the downstream tactile temperature measurement 50 to the controller 114.

The controller 114 may be configured to (a) assign a first upper heater element 101 and second upper heater element 103 to an upper injection end heating zone 512, (b) assign a third upper heater element 105 and a second upper heater element 107 to an upper exhaust end heating zone 514, and (c) assign a plurality of upper intermediate heater elements 109-121 to an upper heater element intermediate heating zone 516. It is further contemplated that the controller 114 be configured to (d) determine a temperature differential between the injection portion 194 and the exhaust portion 196 of the divider 142, and (e) throttle heat generated by one of the upper injection end heating zone 512 of the upper heater element array 106 and the upper exhaust end heating zone 514 relative to the other of the upper injection end heating zone 512 and upper exhaust end heating zone 514 when the determined temperature differential is greater than a predetermined temperature differential. As will be appreciated by those of skill in the art in view of the present disclosure, throttling heat generated by upper heater elements assigned to the upper injection end heating zone 512 and the upper exhaust end heating zone 514 may increase heating of one of the injection portion 194 and the exhaust portion 196 of the divider 142 relative to the other of the injection portion 194 and the exhaust portion 196 of the divider 142 while temperature of the substrate 2 is controlled by optical temperature measurements acquired by the one or more pyrometer 502, which may be operatively connected to the upper intermediate heating zone 516. Advantageously, controlling temperature differential between the injection portion 194 and the exhaust portion 196 enables tuning thickness of the boundary layer of material layer traversing the upper surface of the divider, limiting variation otherwise potentially imparted into the material layer 4 by variation in thickness of the boundary layer within the upper chamber 148 of the chamber body 102 at the upper surface of the divider 142.

With reference to FIGS. 13-15, the material layer deposition method 600 is shown. As shown in FIG. 13, the material layer deposition method 600 includes supporting a substrate on a substrate support, e.g., the substrate 2 (shown in FIG. 1) on the substrate support 104 (shown in FIG. 3), as shown in box 610. A material layer precursor, e.g., the precursor 16 (shown in FIG. 1), is flowed across the substrate and a material layer, e.g., the material layer 4 (shown in FIG. 1), deposited onto the substrate using the material layer precursor, as shown with box 620 and box 630. Heat is communicated to the substrate during deposition of the material layer onto the substrate using an upper heater element array, e.g., the upper heater element array 106 (shown in FIG. 4), is throttled using an optical temperature measurement acquired by a pyrometer during deposition of the material layer onto the substrate, e.g., using the optical temperature measurement 172 (shown in FIG. 4) acquired using the pyrometer 110 (shown in FIG. 3), as shown with box 640. It is also contemplated that heat communicated to the substrate during deposition of the material layer with a lower heater element array, e.g., the lower heater element array 108 (shown in FIG. 3), be independently throttled using a tactile measurement provided by a thermocouple, e.g., the tactile temperature measurement 176 (shown in FIG. 4) provided by the thermocouple 112 (shown in FIG. 3), as shown with box 650. In this respect it is contemplated that the tactile temperature measurement acquired by the thermocouple 112 not be employed to throttle electrical power applied to upper heater elements of the upper heater element array. In further respect, the optical temperature measurement acquired by the pyrometer may not be employed to throttle electrical power applied to lower heater elements of the lower heater element array.

As shown in FIG. 14, seating 610 the substrate may include ramping temperature of the substrate to a predetermined material layer deposition temperature while throttling heat generated by the upper heater element array using optical temperature measurements provided by the pyrometer independent of tactile temperature measurements provided by the thermocouple, as shown with box 612. Seating 610 the substrate on the substrate support may also include ramping temperature of the substrate to the predetermined material layer deposition temperature while throttling heat generated by the lower heater element array using a tactile temperature measurement provided by the thermocouple independent of an optical temperature measurement provided by the pyrometer, as shown with box 614.

Flowing 620 the material layer precursor across the substrate may include flowing a silicon-containing precursor, e.g., the silicon-containing precursor 32 (shown in FIG. 2), across the substrate, as shown with box 622. Flowing 620 the material layer precursor across the substrate may include flowing a germanium-containing precursor, e.g., the germanium-containing precursor 34 (shown in FIG. 2), across the substrate, as shown with box 624. Flowing 620 the material layer precursor across the substrate may include flowing a dopant-containing precursor, e.g., the dopant-containing precursor 36 (shown in FIG. 2), across the substrate, as shown with box 626. Flowing 620 the material layer precursor across the substrate may include flowing a halide-containing material, e.g., the halide-containing material 40 (shown in FIG. 2), across the substrate, as shown with box 628. One of more of the aforementioned precursors and/or the halide-containing material may be carried by a purge/carrier gas, e.g., the purge/carrier gas 38 (shown in FIG. 2), as shown with box 621.

Depositing 630 the material layer onto the substrate may include depositing a silicon-containing material layer onto the substrate, as shown with box 632. Depositing the material layer onto the substrate may include depositing an epitaxial material layer onto the substrate, as shown with box 634. Depositing the material layer onto the substrate may include depositing a silicon-germanium material layer on the substrate, as shown with box 636. The material layer may be doped with phosphorus (P) or arsenic (As), as shown with box 638.

As shown in FIG. 15, heating 640 the substrate with the upper heater element array may include throttling heat generated by the upper heater element array using a second optical temperature measurement acquired by a second pyrometer, e.g., the second optical temperature measurement 306 (shown in FIG. 8) using the second pyrometer 302 (shown in FIG. 7), as shown with box 642. Upper heater elements of the upper heater element array may be assigned into a first upper heating zone operably associated with only the first pyrometer and a second upper heating zone operably associated with only the second pyrometer, e.g., the first upper heating zone 308 (shown in FIG. 8) and the second upper heating zone 310 (shown in FIG. 8), as also shown with box 642. Heating 640 the substrate with the upper heater element array may include throttling heat generated by the upper heater element array using a third optical temperature measurement acquired by a third pyrometer, e.g., the third optical temperature measurement 420 (shown in FIG. 10) using the third pyrometer 404 (shown in FIG. 9), as shown with box 644. Upper heater elements of the upper heater element array may be assigned into heating zones each operatively associated with only one of the pyrometers, e.g., the heating zones 410-414 (shown in FIG. 10), as also shown with box 644. As shown with box 646 and box 648, substrate temperature may be throttled according to a temperature differential and/or a temperature gradient across an upper surface of the substrate determined using the first optical temperature measurement and the second optical temperature measurement. For example, a center-edge differential of substrate temperature may be determined using the first optical temperature measurement and the second optical temperature measurement and heat output of the upper heater element array throttled according slope a line fit to the first optical temperature measurement and the second optical temperature measurement as function of radial distance between the rotation axis and edge of the substrate. Alternatively (or additionally) a center-edge gradient of substrate temperature may be determined using the first optical temperature measurement, the second optical temperature measurement, and the third optical temperature measurement by fitting a second order or higher function to the optical temperature measurements. Heat output of the upper heater element array may be throttled according to the greatest slope of lines tangent to the curve as a function of radial distance between the rotation axis and edge of the substrate.

Heating 650 the substrate with the lower heater element array may include throttling heat generated by the lower heater element array using a second tactile temperature measurement acquired by a static thermocouple, e.g., the second tactile temperature measurement 204 (shown in FIG. 6) acquired by the static thermocouple 202 (shown in FIG. 5), as shown with box 652. Heater element of the lower heater element array may be assigned into a first lower heater element zone and a second lower heater element zone, e.g., the first lower heating zone 206 (shown in FIG. 6) and the second lower heating zone 208 (shown in FIG. 6), as shown with box 654. Heat generated by heater elements assigned to the first lower heater element zone may be throttled using only a first tactile temperature measurement acquired by a rotating thermocouple, e.g., the first tactile temperature measurement 176 (shown in FIG. 6) acquired by the rotating thermocouple 112 (shown in FIG. 5), as shown with box 654. Heat generated by lower heater elements assigned to the second lower heater element zone may be throttled using only a second tactile temperature measurement acquired by the static thermocouple, e.g., the first tactile temperature measurement 176 (shown in FIG. 6), as also shown with box 652.

As shown with box 660, the method may include unseating the substrate from the substrate support. Unseating the substrate may include de-ramping temperature of the substrate from the predetermined material layer deposition temperature to an unloading temperature while throttling the upper heater element array using optical temperature measurements provided by the pyrometer independent of tactile temperature measurements provided by the thermocouple, as shown with box 662. Unseating the substrate may also include ramping temperature of the substrate from the predetermined material layer deposition temperature to an unloading temperature while throttling the lower heater element array using tactile temperature measurements provided by the thermocouple independent of optical temperature measurements provided by the pyrometer, as shown with box 664.

Temperature control during material layer deposition may be accomplished using thermocouples or pyrometers. Thermocouples generally employ dissimilar metals joined to one another that generate a voltage when heated or cooled. Pyrometers typically detect infrared electromagnetic radiation emitted by a target and indicative of temperature of the target. While generally satisfactory for their intended purpose, pyrometers may have difficulty in distinguishing electromagnetic radiation emitted from structures located in the environment surrounding the target, and thermocouples may experience a delay in appreciating temperature change due to the need to communicate temperature change through the bulk material forming the structure to which the thermocouple is attached. Thermocouples and pyrometers may therefore have accuracy insufficient for certain types of material layer deposition operations.

In examples described herein, optical temperature measurements from a pyrometer are employed to control an upper heater element array that directly heats a substrate and tactile temperature measurements from a thermocouple abutting a substrate support seating the substrate controls a lower heater element array indirectly heating the substrate through the bulk material forming the substrate support. Reliable substrate temperature control is achieved by avoid crosstalk between adjustments made to heat output of the lower heater element and heating of the substrate by the upper heater element array. Stabilization time may be reduced by elimination of the crosstalk, and control of the lower heater element array may be decoupled from control of the upper heater element array to enable adaptive power bias control.

Although this disclosure has been provided in the context of certain embodiments and examples, it will be understood by those skilled in the art that the disclosure extends beyond the specifically described embodiments to other alternative embodiments and/or uses of the embodiments and obvious modifications and equivalents thereof. In addition, while several variations of the embodiments of the disclosure have been shown and described in detail, other modifications, which are within the scope of this disclosure, will be readily apparent to those of skill in the art based upon this disclosure. It is also contemplated that various combinations or sub-combinations of the specific features and aspects of the embodiments may be made and still fall within the scope of the disclosure. It should be understood that various features and aspects of the disclosed embodiments can be combined with, or substituted for, one another in order to form varying modes of the embodiments of the disclosure. Thus, it is intended that the scope of the disclosure should not be limited by the particular embodiments described above.

The headings provided herein, if any, are for convenience only and do not necessarily affect the scope or meaning of the devices and methods disclosed herein.

The invention claimed is:

1. A chamber arrangement, comprising:

a chamber body having an upper wall and a lower wall;

a substrate support arranged within an interior of the chamber body and supported for rotation about a rotation axis;

an upper heater element array supported above the upper wall of the chamber body;

a lower heater element array supported below the lower wall of the chamber body;

a pyrometer supported above the upper heater element array and optically coupled to the interior of the chamber body, wherein the pyrometer is operably connected to the upper heater element array;

a rotating thermocouple arranged within the interior of the chamber body and in intimate mechanical contact with the substrate support;

a static thermocouple arranged within the chamber body and fixed relative to the chamber body; and a controller operably connecting the rotating thermocouple to the lower heater element array and the pyrometer to the upper heater element array, the controller responsive to instructions recorded on a memory to:

assign a first lower heater element of the lower heater element array to a first lower heating zone and a second lower heater element of the lower heater element array to a second lower heating zone; and throttle heat generated by the first lower heater element using a first tactile temperature measurement provided by the rotating thermocouple and the second lower heater element using a second tactile temperature measurement provided by the static thermocouple, wherein heat generated by the first lower heater element and the second lower heater element is independent of an optical temperature measurement acquired by the pyrometer.

2. The chamber arrangement of claim 1, wherein the pyrometer is a first pyrometer optically coupled to the substrate support by a first optical axis and further comprising a second pyrometer supported above the chamber body and optically coupled to the substrate support by a second optical axis, the second optical axis radially outward of the first optical axis.

3. The chamber arrangement of claim 2, wherein the second pyrometer is operatively connected to the upper heater element array, wherein the first pyrometer and the second pyrometer are operably disconnected from the lower heater element array.

4. The chamber arrangement of claim 2, wherein the upper heater element array comprises:

a first upper heater element supported above the chamber body;

a second upper heater element supported above the chamber body and longitudinally offset from the first upper heater element between an injection end and an exhaust end longitudinally opposite the injection end of the chamber body;

wherein the first pyrometer is operably connected to the first upper heater element; and wherein the second pyrometer is operably connected to the second upper heater element.

5. The chamber arrangement of claim 2, further comprising a third pyrometer arranged along a third optical axis and optically coupled to the substrate support, wherein the third optical axis is radially intermediate the first optical axis and the second optical axis.

6. The chamber arrangement of claim 5, wherein the upper heater element array comprises:

a first upper heater element supported above the chamber body;

a second upper heater element supported above the chamber body and longitudinally offset from the first upper heater element between an injection end and an exhaust end of the chamber body, the exhaust end longitudinally opposite the injection end of the chamber body;

at least one third upper heater element supported above the chamber body and arranged longitudinally between the injection end and the exhaust end of the chamber body;

wherein the first pyrometer is operably connected to the first upper heater element; and wherein the second pyrometer is operably connected to the second upper heater element, wherein the third pyrometer is operably connected to the at least one third upper heater element.

7. The chamber arrangement of claim 6, wherein the second optical axis is circumferentially offset from the first optical axis, and wherein the third optical axis is circumferentially offset from the both the second optical axis and the first optical axis.

8. The chamber arrangement of claim 1, wherein the upper heater element array includes a plurality of upper heater elements, and wherein the lower heater element array includes a plurality of lower heater elements orthogonal relative to the plurality of upper heater elements.

9. The chamber arrangement of claim 1, wherein the instructions further cause the controller to throttle heat output of the first lower heater element and the second lower heater element according to a temperature differential between the first tactile temperature measurement and the second tactile temperature measurement.

10. The chamber arrangement of claim 1, wherein the pyrometer is a first pyrometer arranged along a first optical axis and further comprising a second pyrometer arranged along a second optical axis radially outward of the first optical axis, wherein the controller is responsive to instructions recorded on the memory to:

assign a first upper heater element of the upper heater element array to a first upper heating zone and a second upper heater element of the upper heater element array to a second upper heating zone;

throttle heat generated by the first upper heater element using a first optical temperature measurement provided by the first pyrometer and the second upper heater element using a second optical temperature measurement provided by the second pyrometer; and wherein the first upper heater element and the second upper heater element are throttled independently of a tactile temperature measurement provided by the rotating thermocouple.

11. The chamber arrangement of claim 10, wherein the instructions further cause the controller to throttle heat generated by the first upper heater element and the second upper heater element according to a temperature differential between the first optical temperature measurement and the second optical temperature measurement.

12. The chamber arrangement of claim 1, wherein the pyrometer is a first pyrometer arranged along a first optical axis and further comprising a second pyrometer arranged along a second optical axis radially outward of the first optical axis and a third pyrometer arranged along a third optical axis radially intermediate the first optical axis and the second optical axis, wherein the controller is responsive to instructions recorded on the memory to:

assign a first upper heater element of the upper heater element array to a first upper heating zone, a second upper heater element of the upper heater element array to a second upper heating zone, and at least one third upper heater element to a third upper heating zone;

throttle heat generated by the first upper heater element using a first optical temperature measurement provided by the first pyrometer, the second upper heater element using a second optical temperature measurement provided by the second pyrometer, and the at least one third upper heater element to a third optical temperature measurement provided by the third pyrometer, and wherein the first upper heater element, the second upper heater element, and the at least one third upper heater element are throttled independent of a tactile temperature measurement provided by the rotating thermocouple.

13. The chamber arrangement of claim 12, wherein the instructions further cause the controller to throttle heat generated by the first upper heater element, the second upper heater element, and the at least one third upper heater element according to a temperature gradient defined by the first optical temperature measurement, the second optical temperature measurement, and the third optical temperature measurement.

14. A chamber arrangement, comprising:

a chamber body having an upper wall and a lower wall;

a substrate support arranged within an interior of the chamber body and supported for rotation about a rotation axis;

an upper heater element array supported above the upper wall of the chamber body;

a lower heater element array supported below the lower wall of the chamber body;

a pyrometer supported above the upper heater element array and optically coupled to the interior of the chamber body, wherein the pyrometer is operably connected to the upper heater element array;

a first static thermocouple arranged within the interior of the chamber body;

a divider fixed within the interior of the chamber body and extending about the substrate support, the divider having an injection portion and an exhaust portion longitudinally separated by the substrate support, and the first static thermocouple connected to the injection portion of the divider;

a second static thermocouple connected to the exhaust portion of the divider and separated from the first static thermocouple by the substrate support; and a controller disposed in communication with the first static thermocouple and the second static thermocouple, the controller configured to:

determine a temperature differential between the injection portion and the exhaust portion of the divider using an injection portion temperature measurement acquired by the first static thermocouple and an exhaust portion temperature acquired by the second static thermocouple;

compare the determined temperature differential to a predetermined temperature value; and increase heating of one of the injection portion of the divider and the exhaust portion of the divider relative to the other of the injection portion and the exhaust portion of the divider.

15. A semiconductor processing system, comprising:

a precursor delivery arrangement including a silicon-containing precursor; and a chamber arrangement as recited in claim 1 connected to the precursor delivery arrangement, wherein a substrate is seated on the substrate support.

* * * * *